(12) United States Patent
Nishida

(10) Patent No.: US 12,324,264 B2
(45) Date of Patent: Jun. 3, 2025

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventor: Keiji Nishida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 378 days.

(21) Appl. No.: 17/757,435

(22) PCT Filed: Oct. 30, 2020

(86) PCT No.: PCT/JP2020/040793
§ 371 (c)(1),
(2) Date: Jun. 15, 2022

(87) PCT Pub. No.: WO2021/131318
PCT Pub. Date: Jul. 1, 2021

(65) Prior Publication Data
US 2023/0008784 A1    Jan. 12, 2023

(30) Foreign Application Priority Data
Dec. 24, 2019  (JP) ................... 2019-232458

(51) Int. Cl.
*H01L 27/146*    (2006.01)
*H10F 39/00*    (2025.01)

(52) U.S. Cl.
CPC ..... *H10F 39/8063* (2025.01); *H10F 39/8027* (2025.01); *H10F 39/8057* (2025.01)

(58) Field of Classification Search
CPC ..... H01L 27/14; H01L 27/144; H01L 27/146; H01L 27/14601; H01L 27/14603;
(Continued)

(56) References Cited

U.S. PATENT DOCUMENTS

| 10,797,090 B2 * | 10/2020 | Perkins | ............. H01L 27/14629 |
| 2014/0306095 A1 * | 10/2014 | Nobayashi | .......... H01L 27/1463 250/208.1 |

(Continued)

FOREIGN PATENT DOCUMENTS

| CN | 103824805 A | 5/2014 |
| CN | 104284106 A | 1/2015 |

(Continued)

OTHER PUBLICATIONS

International Search Report and Written Opinion of PCT Application No. PCT/JP2020/040793, issued on Jan. 19, 2021, 10 pages of ISRWO.

*Primary Examiner* — John R Lee
(74) *Attorney, Agent, or Firm* — CHIP LAW GROUP

(57) ABSTRACT

Provided is a solid-state imaging device that includes a plurality of photoelectric conversion units formed on a substrate to generate signal charges according to an amount of incident light, a microlens array including a microlens for a photoelectric conversion unit group including at least two or more adjacent photoelectric conversion units to guide incident light to the photoelectric conversion unit group, a scatterer on an optical path of the incident light collected by the microlens, and an inter-pixel light shielding portion including a groove between the photoelectric conversion unit of the photoelectric conversion unit group and the photoelectric conversion unit adjacent to the photoelectric conversion unit group and an insulating material filled in the groove. An opening side of an inner side surface of the groove on the scatterer side is a flat surface inclined so that a groove width becomes narrower toward a bottom of the groove.

12 Claims, 37 Drawing Sheets

(58) Field of Classification Search
CPC ......... H01L 27/14605; H01L 27/14607; H01L 27/14609; H01L 27/1461; H01L 27/14612; H01L 27/14614; H01L 27/14616; H01L 27/14618; H01L 27/1462; H01L 27/14621; H01L 27/14623; H01L 27/14625; H01L 27/14627; H01L 27/14629; H01L 27/1463; H01L 27/14632; H01L 27/14634; H01L 27/14636; H01L 27/14638; H01L 27/1464; H01L 27/14641; H01L 27/14643; H01L 27/14645; H01L 27/14647; H04N 25/70; H04N 25/76; H04N 25/77; H04N 25/79; H10F 39/802; H10F 39/8027; H10F 39/80; H10F 39/8063; H10F 39/806; H10F 39/805; H10F 39/8057
See application file for complete search history.

(56) References Cited

U.S. PATENT DOCUMENTS

| | | |
|---|---|---|
| 2017/0104020 A1 | 4/2017 | Lee et al. |
| 2018/0102389 A1 | 4/2018 | Lee |
| 2018/0182806 A1 | 6/2018 | Jin |
| 2018/0204961 A1 | 7/2018 | Lee |
| 2018/0286895 A1 | 10/2018 | Watanabe |
| 2018/0350856 A1* | 12/2018 | Masagaki ............... H01L 21/76 |
| 2019/0296070 A1 | 9/2019 | Jin |
| 2023/0008784 A1* | 1/2023 | Nishida ................ H01L 27/146 |
| 2023/0170373 A1* | 6/2023 | Noh ................ H01L 27/14636 257/432 |
| 2023/0326942 A1* | 10/2023 | Wang ................ H01L 27/1464 |
| 2023/0343808 A1* | 10/2023 | Wang ................ H01L 27/14645 |

FOREIGN PATENT DOCUMENTS

| | | | |
|---|---|---|---|
| JP | 2004228407 A | 8/2004 | |
| JP | 2009224408 A | 10/2009 | |
| JP | 2011138905 A | 7/2011 | |
| JP | 2013-150314 A | 8/2013 | |
| JP | 2015029054 A | 2/2015 | |
| JP | 2015060855 A | 3/2015 | |
| JP | 2017212351 A | 11/2017 | |
| JP | 2018029170 A | 2/2018 | |
| JP | 2018-201015 A | 12/2018 | |
| TW | 201933597 A | 8/2019 | |
| TW | 201935672 A | 9/2019 | |
| WO | 2017/130723 A1 | 8/2017 | |
| WO | WO-2018083990 A1 | 5/2018 | |

\* cited by examiner

SOLID-STATE IMAGING DEVICE AND ELECTRONIC DEVICE

CROSS REFERENCE TO RELATED APPLICATIONS

This application is a U.S. National Phase of International Patent Application No. PCT/JP2020/040793 filed on Oct. 30, 2020, which claims priority benefit of Japanese Patent Application No. JP 2019-232458 filed in the Japan Patent Office on Dec. 24, 2019. Each of the above-referenced applications is hereby incorporated herein by reference in its entirety.

TECHNICAL FIELD

The present technology relates to a solid-state imaging device and electronic device.

BACKGROUND ART

In the related art, as a structure in which four adjacent photoelectric conversion units share one microlens, a solid-state imaging device that can calculate a distance to a subject on the basis of signal charges generated by the four photoelectric conversion units has been proposed (see, for example, PTL 1). In the solid-state imaging device disclosed in PTL 1, a scatterer is provided at a light collecting point of a microlens, so that the collected light is scattered by the scatterer and distributed to four adjacent photoelectric conversion units. In addition, a difference in light-receiving sensitivity (sensitivity difference between same colors) between the photoelectric conversion units due to pupil correction or the like is suppressed.

CITATION LIST

Patent Literature

[PTL 1]
JP 2013-211413 A

SUMMARY

Technical Problem

However, in the solid-state imaging device disclosed in PTL 1, light is distributed by the scatterer, and thus scattered light infiltrates into the surrounding photoelectric conversion units, which results in a possibility that mixing between different colors will occur. For this reason, there is a possibility that the quality of an image obtained by the solid-state imaging device will be degraded.

An object of the present disclosure is to provide a solid-state imaging device and an electronic device capable of suppressing color mixing between different colors while reducing the sensitivity difference between same colors.

Solution to Problem

A solid-state imaging device of the present disclosure includes: (a) a plurality of photoelectric conversion units formed on a substrate to generate signal charges according to an amount of incident light; (b) a microlens array including a microlens formed for a photoelectric conversion unit group including at least two or more adjacent photoelectric conversion units to guide incident light to the photoelectric conversion unit group; (c) a scatterer disposed on an optical path of the incident light collected by the microlens; and (d) an inter-pixel light shielding portion including a groove formed between the photoelectric conversion unit of the photoelectric conversion unit group and the photoelectric conversion unit adjacent to the photoelectric conversion unit group and an insulating material filled in the groove, wherein (e) an opening side of an inner side surface of the groove on the scatterer side is a flat surface inclined or a curved surface curved so that a groove width becomes narrower toward a bottom of the groove.

Further, an electronic device of the present disclosure includes: (a) a solid-state imaging device including: a plurality of photoelectric conversion units formed on a substrate to generate signal charges according to an amount of incident light; a microlens array including a microlens formed for a photoelectric conversion unit group including at least two or more adjacent photoelectric conversion units to guide incident light to the photoelectric conversion unit group; a scatterer disposed on an optical path of the incident light collected by the microlens; and an inter-pixel light shielding portion including a groove formed between the photoelectric conversion unit of the photoelectric conversion unit group and the photoelectric conversion unit adjacent to the photoelectric conversion unit group and an insulating material filled in the groove, an opening side of an inner side surface of the groove on the scatterer side being a flat surface inclined or a curved surface curved so that a groove width becomes narrower toward a bottom of the groove; (b) an optical lens that forms image light from a subject on an imaging surface of the solid-state imaging device; and (c) a signal processing circuit that processes a signal output from the solid-state imaging device.

DESCRIPTION OF EMBODIMENTS

Hereinafter, examples of a solid-state imaging device 1 and electronic device according to an embodiment of the present disclosure will be described with reference to FIGS. 1, 2A, 2B, 3A, 3B, 3C, 3D, 3E, 3F, 3G, 3H, 4, 5A, 5B, 5C, 5D, 5E, 6A, 6B, 7, 8, 9, 10, 11, 12, 13, 14, 15, 16, 17, 18, 19, 20, 21, 22, 23, and 24. The embodiment of the present disclosure will be described in the following order. Note, however, that the present disclosure is not limited to the following examples. In addition, the effects described in this specification are exemplary and not limiting, and other effects may be provided.

1. First Embodiment: Solid-State Imaging Device
1-1 Overall Configuration of Solid-State Imaging Device
1-2 Configurations of Main Parts
1-3 Method of Forming Scatterer and Inter-Pixel Light Shielding Portion
2. Second Embodiment: Solid-State Imaging Device
2-1 Configurations of Main Parts
2-2 Method of Forming Scatterer and Inter-Pixel Light Shielding Portion
2-3 Modification Example
3. Application Example to Electronic Device
4. Application Example to Moving Body
5. Application Example to Endoscopic Surgery System

1. First Embodiment: Solid-State Imaging Device

1-1 Overall Configuration of Solid-State Imaging Device

Figure 1:
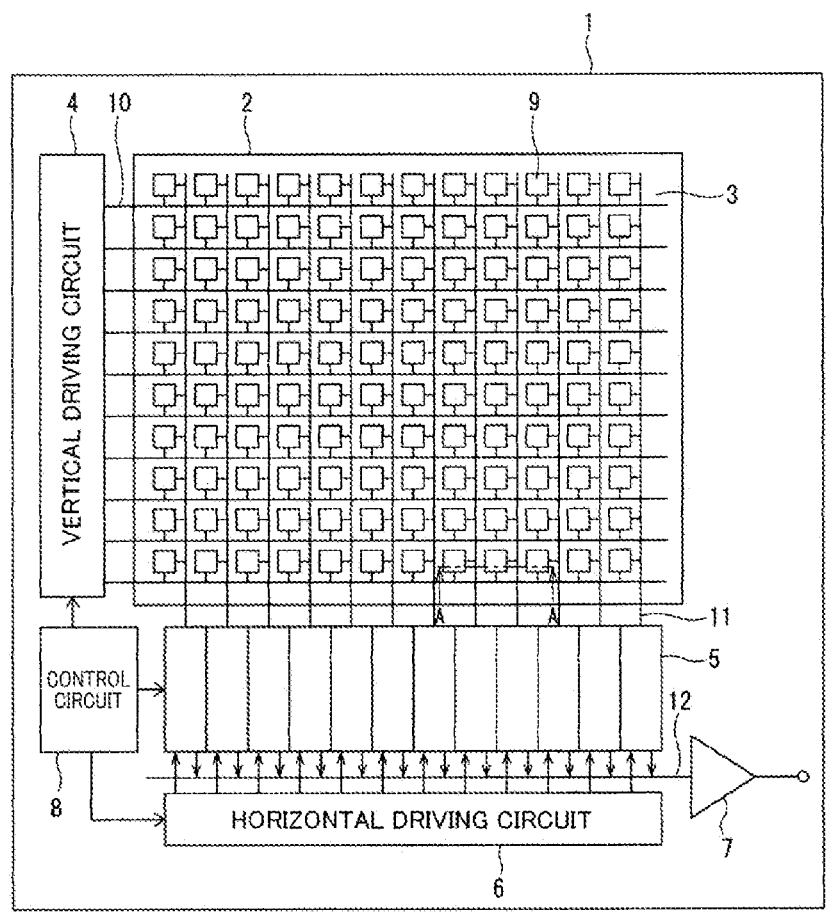
FIG. 1 is a diagram illustrating the overall configuration of a solid-state imaging device according to a first embodiment.

The solid-state imaging device 1 according to the first embodiment of the present disclosure will be described. FIG. 1 is a schematic configuration diagram illustrating the entire solid-state imaging device 1 according to the first embodiment of the present disclosure.

Figure 20:
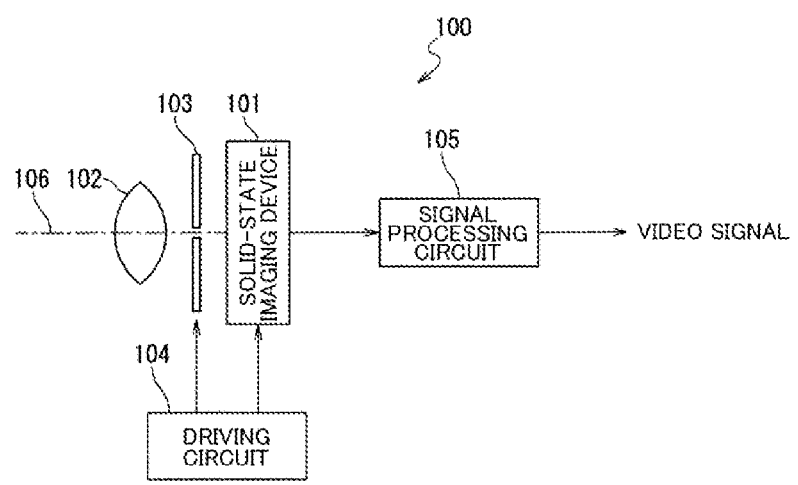
FIG. 20 is a diagram showing an example of a schematic configuration of an electronic device.

The solid-state imaging device 1 in FIG. 1 is a backside irradiation type complementary metal oxide semiconductor (CMOS) image sensor. As illustrated in FIG. 20, the solid-state imaging device 1 (101) takes in image light (incident light 106) from a subject through an optical lens 102, converts the amount of incident light 106 imaged on an imaging surface into an electrical signal in units of pixels, and outputs the electrical signal as a pixel signal.

As illustrated in FIG. 1, the solid-state imaging device 1 according to the first embodiment includes a substrate 2, a pixel region 3, a vertical driving circuit 4, column signal processing circuits 5, a horizontal driving circuit 6, an output circuit 7, and a control circuit 8.

The pixel region 3 includes a plurality of pixels 9 arranged regularly in a two-dimensional array on the substrate 2. The pixel 9 includes a photoelectric conversion unit 21 illustrated in FIGS. 2A and 2B, and a plurality of pixel transistors (not illustrated). As the plurality of pixel transistors, for example, four transistors, that is, a transfer transistor, a reset transistor, a selection transistor, and an amplifier transistor can be adopted. In addition, for example, the three transistors except for the selection transistor may be adopted.

The vertical driving circuit 4, which is constituted by, for example, a shift register, selects a desired pixel driving wiring 10, supplies a pulse for driving the pixels 9 to the selected pixel driving wiring 10, and drives the pixels 9 in units of rows. That is, the vertical driving circuit 4 sequentially performs selection scanning on the pixels 9 in the pixel region 3 in a vertical direction in units of rows, and supplies a pixel signal based on signal charges generated in accordance with the amount of light received in the photoelectric conversion unit 21 of each of the pixels 9 to the column signal processing circuit 5 through vertical signal lines 11.

The column signal processing circuit 5 is disposed, for example, for each column of the pixel 9, and performs signal processing such as noise removal for each pixel column on a signal which is output from the pixels 9 corresponding to one row. For example, the column signal processing circuit 5 performs signal processing such as correlated double sampling (CDS) and analog digital (AD) conversion for removing pixel-specific fixed pattern noise.

The horizontal driving circuit 6, which is constituted by, for example, a shift register, sequentially outputs a horizontal scanning pulse to the column signal processing circuits 5 to select each of the column signal processing circuits 5 in order, and outputs a pixel signal having been subjected to signal processing to the horizontal signal line 12 from each of the column signal processing circuits 5.

The output circuit 7 performs signal processing on pixel signals sequentially supplied and outputs the pixel signals through the horizontal signal line 12 from each of the column signal processing circuits 5. Examples of the signal processing which may be used include buffering, black level adjustment, array variation correction, various digital signal processing, and the like.

The control circuit 8 generates a clock signal or a control signal as a reference for operations of the vertical driving circuit 4, the column signal processing circuit 5, the horizontal driving circuit 6, and the like on the basis of a vertical synchronization signal, a horizontal synchronization signal, and a master clock signal. In addition, the control circuit 8 outputs the generated clock signal or control signal to the vertical driving circuit 4, the column signal processing circuit 5, the horizontal driving circuit 6, and the like.

1-2 Configurations of Main Parts

Figure 2A:
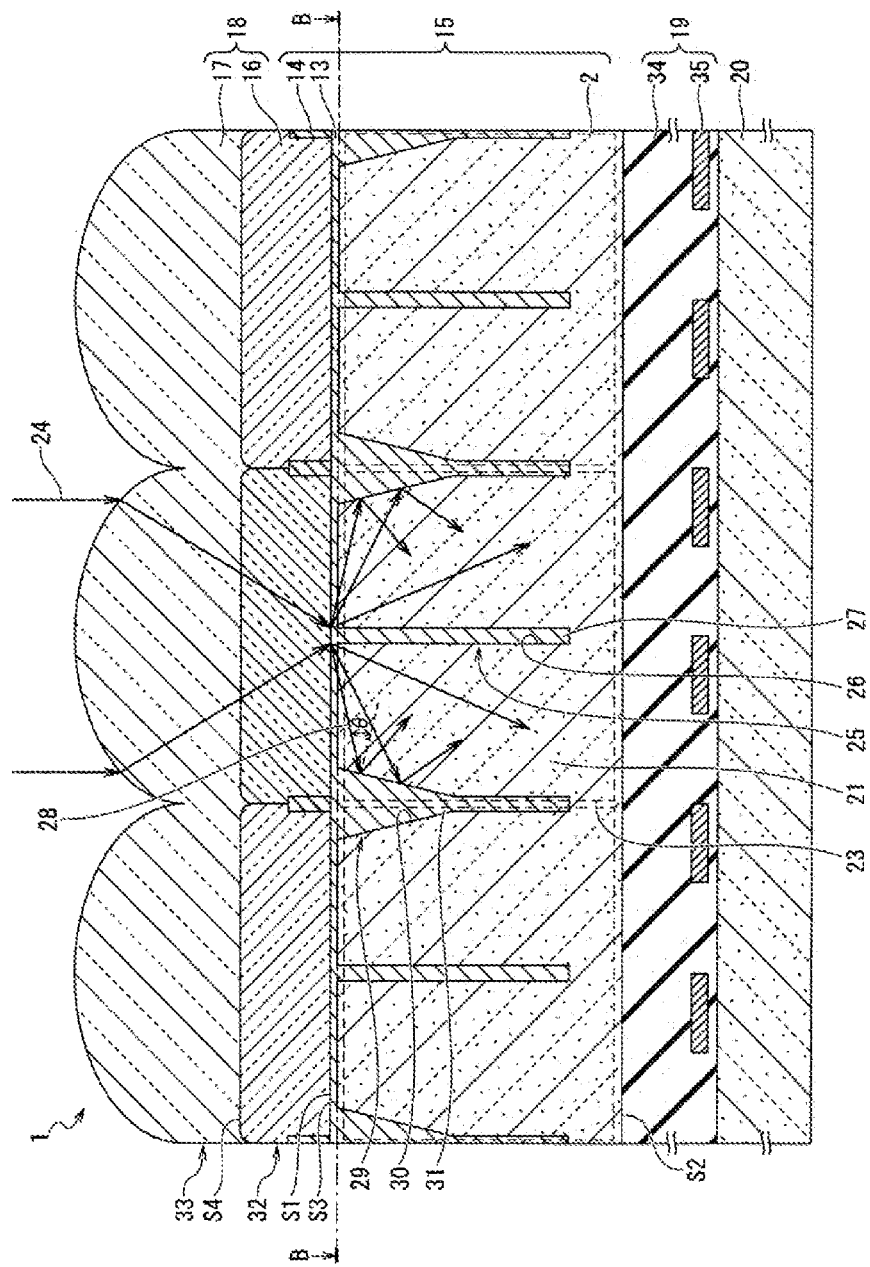
FIG. 2A is a diagram illustrating a cross-sectional configuration of a pixel region along line A-A in FIG. 1.
Figure 2B:
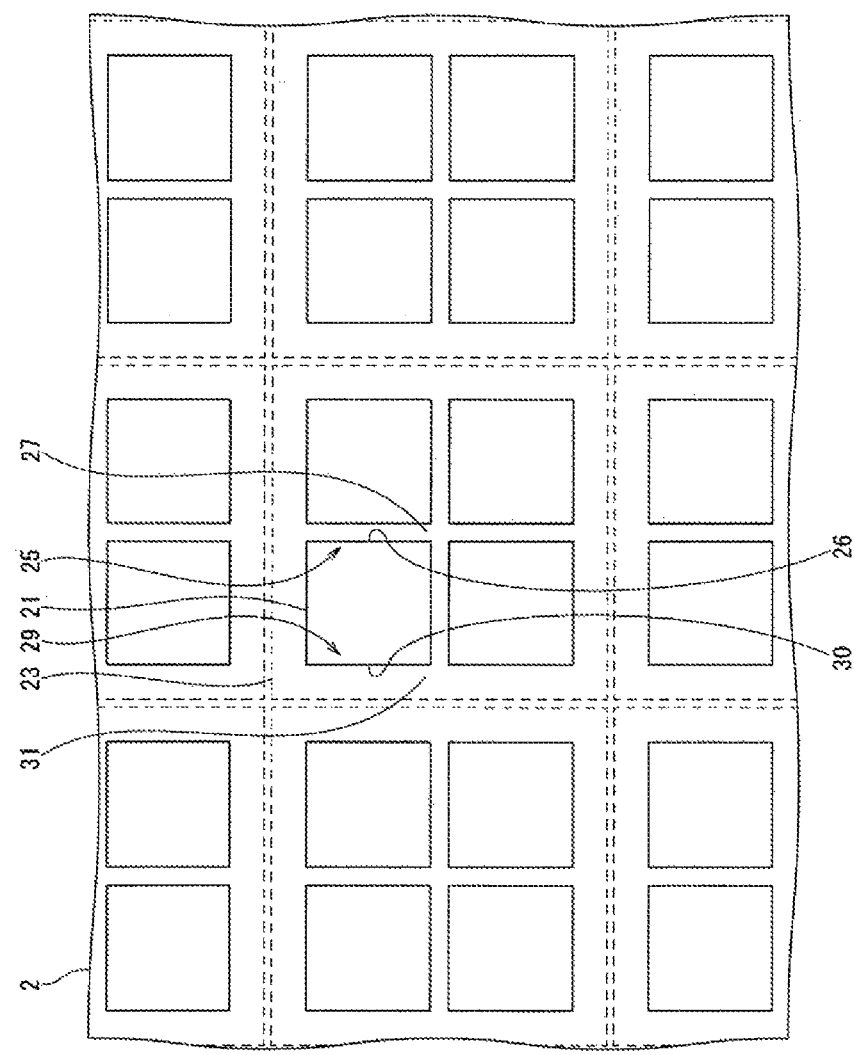
FIG. 2B is a diagram illustrating a cross-sectional configuration of a pixel region along line B-B in FIG. 2A.

Next, a detailed configuration of the solid-state imaging device 1 in FIG. 1 will be described. FIG. 2A is a diagram illustrating a cross-sectional configuration of the pixel region 3 of the solid-state imaging device 1. FIG. 2B is a diagram illustrating planar configurations of the substrate 2 along line B-B in FIG. 2A. In FIGS. 2A and 2B, a backside irradiation type CMOS image sensor (CMOS type solid-state imaging device) is used as the solid-state imaging device 1.

As illustrated in FIGS. 2A and 2B, the solid-state imaging device 1 according to the first embodiment includes a light receiving layer 15 in which the substrate 2, an insulating film 13, and a light shielding film 14 are laminated in this order. In addition, a light collecting layer 18 in which a color filter 16 and a microlens 17 (an on-chip lens, a wafer lens) are laminated in this order is formed on a surface of the light receiving layer 15 on the insulating film 13 side (hereinafter, also referred to as a "rear surface S1"). Further, a wiring layer 19 and a supporting substrate 20 are laminated in this order on a surface of the light receiving layer 15 on the substrate 2 side (hereinafter, also referred to as a "surface S2"). Meanwhile, the rear surface S1 of the light receiving layer 15 and the rear surface of the insulating film 13 are the same surface, and thus the rear surface of the insulating film 13 will be referred to as a "rear surface S1" in the following description. In addition, the surface S2 of the light receiving layer 15 and the surface of the substrate 2 are the same surface, and thus the surface of the substrate 2 will be referred to as a "surface S2" in the following description.

The substrate 2 is constituted by a semiconductor substrate formed of, for example, silicon (Si), and forms the pixel region 3 illustrated in FIG. 1. As illustrated in FIGS. 2A and 2B, a plurality of photoelectric conversion units 21 formed on the substrate 2, that is, the plurality of pixels 9 configured to include the plurality of photoelectric conversion units 21 embedded into the substrate 2 are disposed in a two-dimensional array in the pixel region 3. In the photoelectric conversion unit 21, signal charges corresponding to the amount of incident light 24 are generated, and the generated signal charges are accumulated.

Regarding the photoelectric conversion unit 21, at least two or more adjacent photoelectric conversion units 21 constitute a photoelectric conversion unit group 23. In the first embodiment, the photoelectric conversion unit group 23 is composed of four photoelectric conversion units 21 having 2 rows and 2 columns. A plurality of the photoelectric conversion unit groups 23 are configured using all the photoelectric conversion units 21. In this way, the photoelectric conversion unit group 23 is arranged in a two-dimensional array.

A scatterer 25 that scatters the incident light 24 is formed between the photoelectric conversion units 21 constituting the photoelectric conversion unit group 23, that is, on the optical path of the incident light 24 collected by the microlens 17. By scattering the incident light 24 with the scatterer 25, the scattered incident light 24 can be distributed to the four photoelectric conversion units 21 adjacent to the scatterer 25. Therefore, it is possible to suppress a difference in light-receiving sensitivity (sensitivity difference between same colors) between the four photoelectric conversion units 21 caused by pupil correction or the like.

The scatterer 25 is configured to include a scatterer groove 26 formed in the depth direction from the surface (hereinafter, also referred to as "back surface S3") of the substrate 2 on the insulating film 13 side and a scatterer insulating material 27 filled in the scatterer groove 26. As illustrated in FIG. 2B, the scatterer groove 26 is formed in a grid pattern so as to physically separate the photoelectric conversion units 21 constituting the photoelectric conversion unit group 23. The two inner side surfaces of the scatterer groove 26 are flat surfaces formed so as to extend in the depth direction from the back surface S3 side (light receiving surface side) of the substrate 2 so that the groove width is constant. That is, the scatterer groove 26 has a straight shape extending linearly in the depth direction of the substrate 2. By adopting the straight shape, it is possible to suppress the reduction in the volume of the photoelectric conversion unit 21 adjacent to the scatterer 25, and suppress the reduction in the number of saturated electrons in the photoelectric conversion unit 21. As the scatterer insulating material 27, the same insulating material as the insulating material constituting the insulating film 13 is used.

The scattering of the incident light 24 by the scatterer 25 is performed at the intersection of the interface between the scatterer 25 and the photoelectric conversion unit 21 and the back surface S3 of the substrate 2. Therefore, as for the scattered light 28 incident on the inter-pixel light shielding portion 29 illustrated in FIG. 2A, the closer the scattered light 28 is to the back surface S3 (light receiving surface) of the substrate 2, the larger the incidence angle of the scattered light 28 incident on the inter-pixel light shielding portion 29. Therefore, at a certain depth from the back surface S3 of the substrate 2 (hereinafter, also referred to as a "critical depth"), if "incidence angle θ of the scattered light 28 to the inter-pixel light shielding portion 29"="critical angle (the minimum incidence angle at which total reflection occurs when light is incident from the photoelectric conversion unit 21 to the inter-pixel light shielding portion 29)", at a location shallower than the critical depth, "incidence angle θ of the scattered light 28 on the inter-pixel light shielding portion 29"<"critical angle" and the scattered light 28 will be totally reflected at the interface with the inter-pixel light shielding portion 29. On the other hand, at a location deeper than the critical depth, "incidence angle θ of the scattered light 28 on the inter-pixel light shielding portion 29">"critical angle", and the scattered light 28 will not be totally reflected at the interface with the inter-pixel light shielding portion 29.

The inter-pixel light shielding portion 29 is formed between the photoelectric conversion unit groups 23 (in other words, between the photoelectric conversion unit 21 in one photoelectric conversion unit group 23 and the photoelectric conversion unit 21 adjacent to the photoelectric conversion unit group 23). The inter-pixel light shielding portion 29 is configured to include a groove 30 formed in the depth direction from the back surface S3 side (light receiving surface side) of the substrate 2 and an insulating material 31 filled in the groove 30. As illustrated in FIG. 2B, the groove 30 is formed in a grid pattern so as to physically separate the photoelectric conversion unit groups 23. The opening side of the two inner side surfaces of the groove 30 (in other words, the opening side of the inner side surface of the groove 30 on the scatterer 25 side and the opening side of the inner side surface opposite to the inner side surface) is a flat surface that is inclined so that the groove width becomes narrower toward the bottom of the groove 30. That is, the opening side of the groove 30 has a tapered shape in which the groove width becomes narrower toward the bottom of the groove 30. By adopting the tapered shape, the incidence angle θ of the scattered light 28 to the inter-pixel light shielding portion 29 can be increased, the critical depth can be reduced, and a region where the incidence angle θ of the scattered light 28 at the interface between the inter-pixel light shielding portion 29 and the photoelectric conversion unit 21 is larger than the critical angle can be expanded. Therefore, it is possible to suppress the entering of the scattered light 28 into the inter-pixel light shielding portion 29, suppress the entering of the scattered light 28 into the surrounding photoelectric conversion unit 21, and reduce the color mixing between different colors. As a result, the quality of the image obtained by the solid-state imaging device 1 can be improved.

At that time, the inclination angle of the flat surface constituting the opening side of the two inner side surfaces of the groove 30 with respect to the thickness direction of the substrate 2 is preferably equal to or larger than the critical angle (the minimum incidence angle at which total reflection occurs when light is incident from the photoelectric conversion unit 21 to the inter-pixel light shielding portion 29). For example, when the photoelectric conversion unit 21 is composed of silicon (Si) and the insulating material 31 of the inter-pixel light shielding portion 29 is composed of a silicon oxide (SiO₂), the critical angle is 20.5°. Thus, the inclination angle is preferably 20.5° or more. By setting the inclination angle of the flat surface to 20.5° or more, the scattered light 28 entering the inter-pixel light shielding portion 29 can be more reliably totally reflected on the opening side of the groove 30.

If the inter-pixel light shielding portion 29 has a tapered shape (that is, a shape in which the groove width becomes narrower toward the opening of the groove 30), the opening area of the photoelectric conversion unit 21 becomes narrower, and the sensitivity of the photoelectric conversion unit 21 decreases. However, when the photoelectric conversion unit group 23 is composed of four photoelectric conversion units 21 having 2 rows and 2 columns, the position of the scatterer 25 becomes a focusing point, and the amount of light incident on the vicinity of the inter-pixel light shielding portion 29 is originally small. Thus, the amount of decrease in sensitivity of the photoelectric conversion unit 21 will be relatively small.

When the opening area of the photoelectric conversion unit 21 is narrowed, the amount of charge that can be accumulated in the vicinity of the opening of the photoelectric conversion unit 21 is reduced. However, since the signal charge generated in the vicinity of the opening is relatively small, the effect of reducing the amount of charge that can be accumulated in the vicinity of the opening is relatively small.

The bottom side of the two inner side surfaces of the groove 30 (in other words, the bottom surface side of the inner side surface of the groove 30 on the scatterer 25 side and the bottom surface side of the inner side surface opposite to the inner side surface) is a flat surface formed so as to extend in the depth direction from the back surface S3 side (light receiving surface side) of the substrate 2 so that the groove width is constant. That is, the bottom side of the groove 30 has a straight shape extending linearly in the depth direction of the substrate 2. In this way, the groove 30 has a two-stage structure of a tapered shape and a straight shape. By adopting the straight shape, it is possible to suppress the reduction in the volume of the photoelectric conversion unit 21 adjacent to the inter-pixel light shielding portion 29, and suppress the reduction in the number of saturated electrons in the photoelectric conversion unit 21.

When the groove 30 has a straight shape, the incidence angle θ of the scattered light 28 on the inter-pixel light shielding portion 29 is lower than that of the tapered shape. However, since the incidence angle θ of the scattered light 28 is large in the straight portion, that is, the bottom side of the groove 30, by designing such that (incidence angle θ)≥(critical angle) at the boundary between the tapered shape and the straight shape, it is possible to suppress the entering of the scattered light 28 into the inter-pixel light shielding portion 29, suppress the entering of the scattered light 28 into the surrounding photoelectric conversion unit 21, and reduce the color mixture between different colors. As a result, deterioration of the quality of the image obtained by the solid-state imaging device 1 can be suppressed.

As the insulating material 31 of the inter-pixel light shielding portion 29, the same insulating material as the insulating material constituting the insulating film 13 and the scatterer insulating material 27 is used.

The insulating film 13 continuously covers the entire substrate 2 on the back surface S3 side (the entirety on a light receiving surface side). In addition, the light shielding film 14 is formed in a lattice shape in a portion of the insulating film 13 on the rear surface S1 side (a portion on a light receiving surface side) so that a light receiving surface of each of the plurality of photoelectric conversion unit groups 23 is open.

The color filter 16 is formed to correspond to each of the photoelectric conversion unit groups 23 on the rear surface S1 side (light receiving surface side) of the insulating film 13. That is, one color filter 16 is formed for one photoelectric conversion unit group 23. Thereby, the color filters 16 form color filter arrays 32 that are regularly arranged in a two-dimensional array. Each of the color filters 16 is configured to transmit a specific wavelength of incident light 24, such as red, green, or blue, which is desired to be received by the photoelectric conversion unit group 23 and allow the transmitted incident light 24 to be incident on the photoelectric conversion unit 21.

The microlens 17 is formed to correspond to each of the photoelectric conversion unit groups 23 on the rear surface S4 side (light receiving surface side) of the color filter 16. That is, one microlens 17 is formed for one of the plurality of photoelectric conversion unit groups 23. In this way, the microlenses 17 form microlens arrays 33 that are regularly arranged in a two-dimensional array. Each of the microlenses 17 is configured to collect image light (incident light 24) from a subject and guide the collected incident light 24 to the vicinity of the back surface (light receiving surface) of the scatterer 25 through the color filter 16.

In this manner, when a structure in which one microlens 17 is shared by at least two or more adjacent photoelectric conversion units 21 (photoelectric conversion unit group 23) is adopted, there is a difference between signal charges generated by the respective photoelectric conversion units 21 included in the same photoelectric conversion unit group 23. For this reason, in the solid-state imaging device 1, a distance to the subject can be calculated on the basis of the difference between signal charges.

The wiring layer 19 is formed on the surface S2 side of the substrate 2, and is configured to include an insulating interlayer film 34 and wirings 35 laminated as a plurality of layers with the insulating interlayer film 34 interposed therebetween. The wiring layer 19 drives a pixel transistor constituting the pixels 9 through the plurality of layers of wirings 35.

The supporting substrate 20 is formed on a surface of the wiring layer 19 on a side opposite to a surface facing the substrate 2. The supporting substrate 20 is a substrate for securing the strength of the substrate 2 at a manufacturing stage of the solid-state imaging device 1. As a material of the supporting substrate 20, for example, silicon (Si) can be used.

In the solid-state imaging device 1 having the above-described configuration, light is emitted from the rear surface side of the substrate 2 (the rear surface S1 side of the light receiving layer 15), the emitted light passes through the microlenses 17 and the color filters 16, and the transmitted light is subjected to photoelectric conversion by the photoelectric conversion units 21, thereby generating signal charges. In addition, the generated signal charges are output as a pixel signal by the vertical signal line 11, illustrated in FIG. 1, which is formed by the wirings 35 through the pixel transistors formed on the surface S2 side of the substrate 2.

In addition, a distance to a subject can be calculated on the basis of a difference between signal charges generated by the respective photoelectric conversion units 21 included in the same photoelectric conversion unit group 23 among the generated signal charges.

1-3 Method of Forming Scatterer and Inter-Pixel Light Shielding Portion

Next, a method of forming the scatterer 25 and the inter-pixel light shielding portion 29 in the solid-state imaging device 1 of the first embodiment will be described.

Figure 3A:
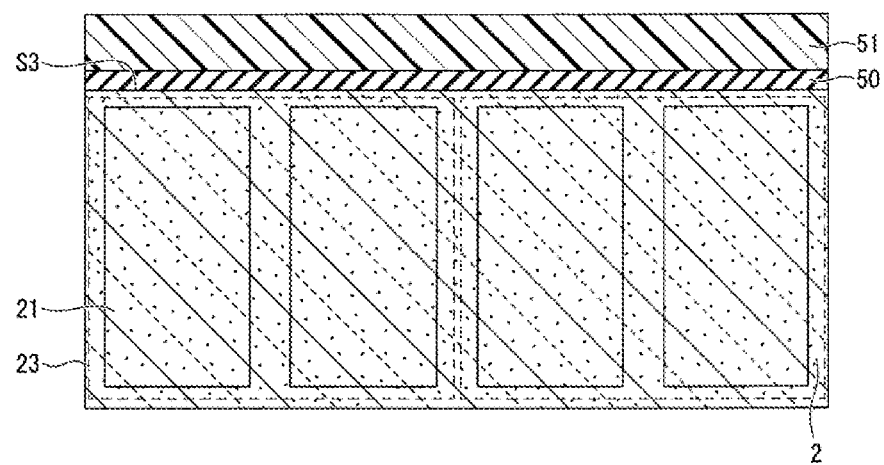
FIG. 3A is an explanatory diagram illustrating a method of forming a scatterer and an inter-pixel light shielding portion.
Figure 3B:
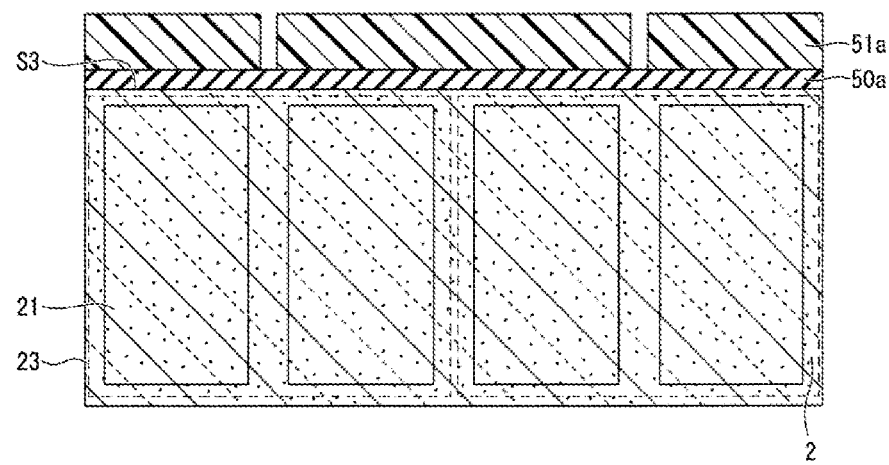
FIG. 3B is an explanatory diagram illustrating a method of forming a scatterer and an inter-pixel light shielding portion.
Figure 3C:
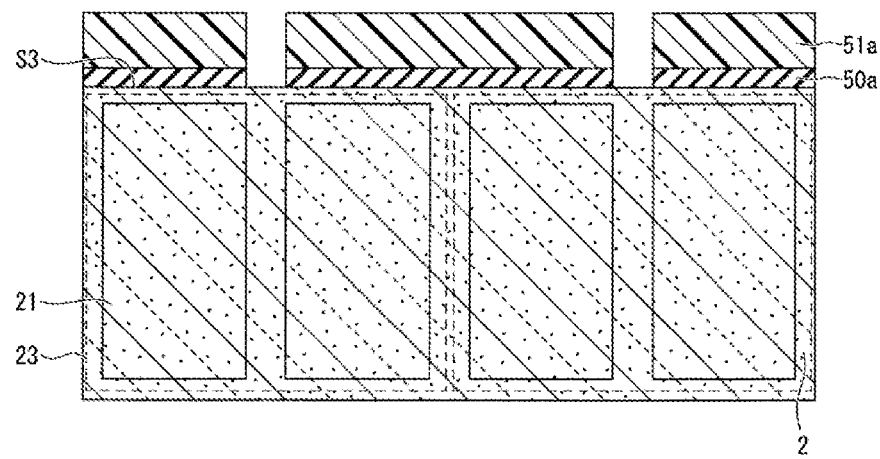
FIG. 3C is an explanatory diagram illustrating a method of forming a scatterer and an inter-pixel light shielding portion.
Figure 3D:
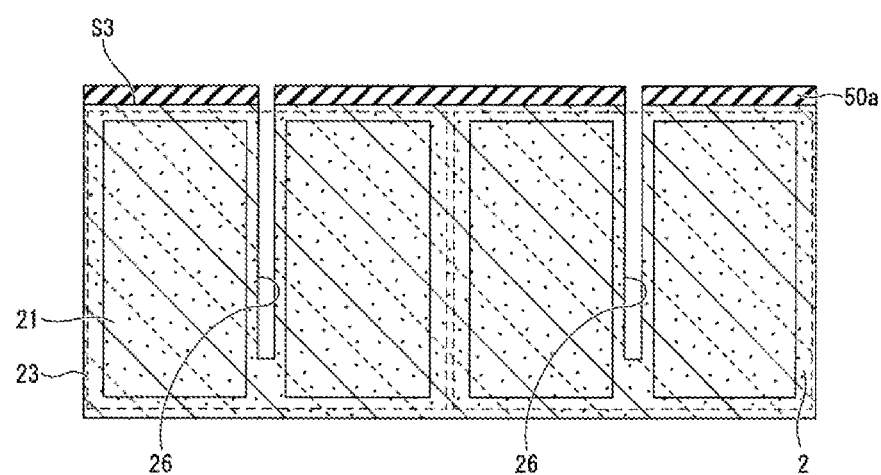
FIG. 3D is an explanatory diagram illustrating a method of forming a scatterer and an inter-pixel light shielding portion.

First, as illustrated in FIG. 3A, a hard mask layer 50 and a resist layer 51 are formed in that order on the back surface S3 of the substrate 2 having the photoelectric conversion unit 21. Subsequently, as illustrated in FIG. 3B, the resist layer 51 is exposed and developed to form a mask 51a having a grid-like opening at a position where the scatterer groove 26 is to be formed. Subsequently, as illustrated in FIG. 3C, the hard mask layer 50 is etched using the formed mask 51a to form a hard mask 50a. In this way, the pattern shape of the hard mask 50a becomes the same as the pattern shape of the mask 51a. Subsequently, as illustrated in FIG. 3D, after removing the mask 51a from the hard mask 50a, dry etching is performed using the hard mask 50a to form a scatterer groove 26 on the substrate 2.

Figure 3E:
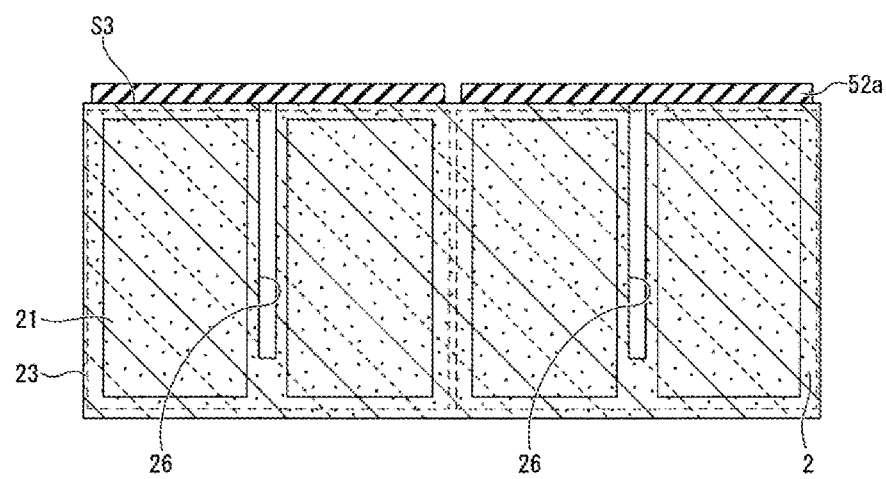
FIG. 3E is an explanatory diagram illustrating a method of forming a scatterer and an inter-pixel light shielding portion.
Figure 3F:
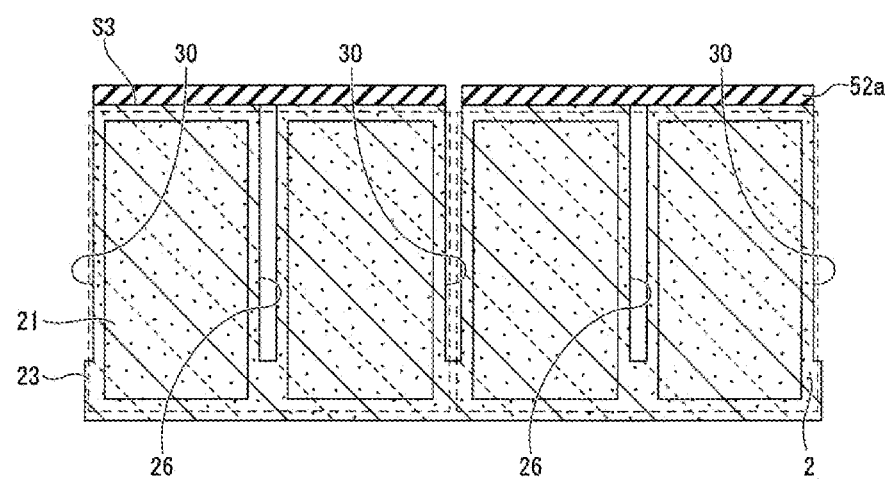
FIG. 3F is an explanatory diagram illustrating a method of forming a scatterer and an inter-pixel light shielding portion.
Figure 3G:
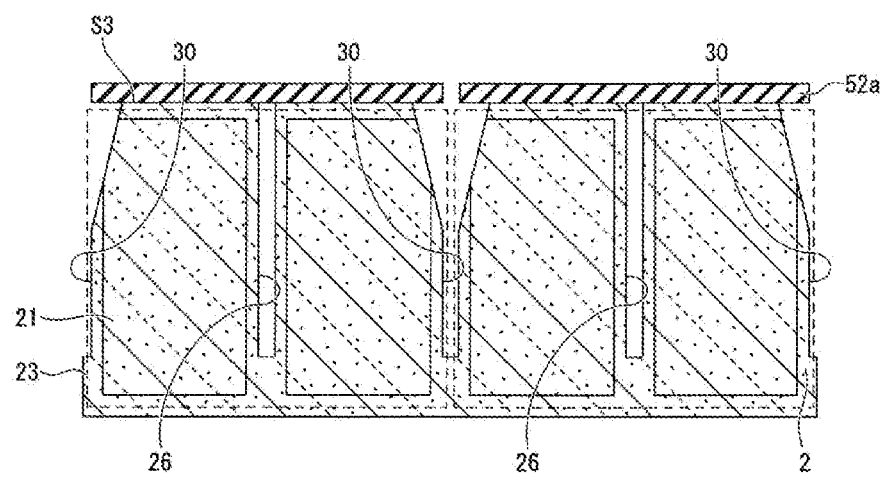
FIG. 3G is an explanatory diagram illustrating a method of forming a scatterer and an inter-pixel light shielding portion.
Figure 3H:
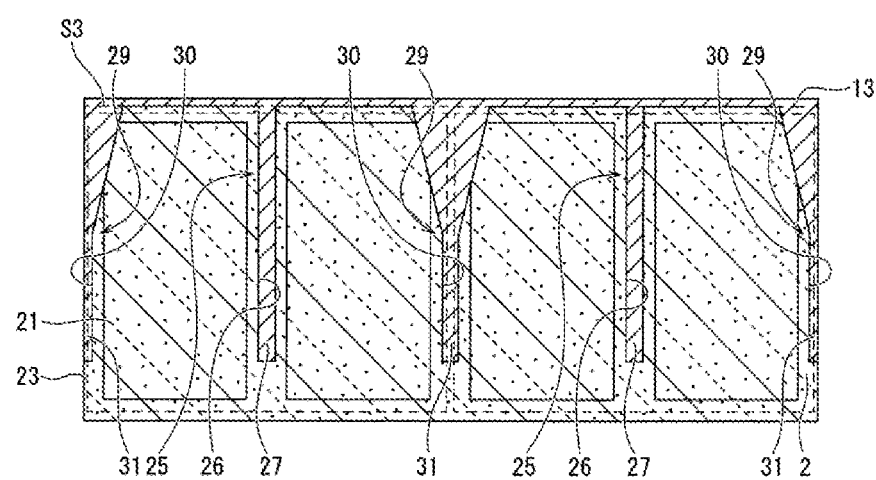
FIG. 3H is an explanatory diagram illustrating a method of forming a scatterer and an inter-pixel light shielding portion.

Subsequently, as illustrated in FIG. 3E, a hard mask 52a having a grid-like opening is formed at a position where the groove 30 is to be formed by the same procedure as the above procedure. The width of the opening is the same as the width of the groove 30 on the bottom side. Subsequently, as illustrated in FIG. 3F, dry etching is performed using the hard mask 52a to form the groove 30 on the substrate 2. In this way, the straight groove 30 is formed. Subsequently, as illustrated in FIG. 3G, wet etching is performed using the hard mask 52a to form a tapered inner side surface of the groove 30 on the opening side. In this way, the groove 30 having a two-stage structure of a tapered shape and a straight shape is obtained. Subsequently, as illustrated in FIG. 311, after removing the hard mask 52a from the substrate 2, the scatterer groove 26 is filled with the scatterer insulating material 27 and the groove 30 is filled with the insulating material 31 using a chemical vapor deposition (CVD) method or the like. In this way, the substrate 2 on which the scatterer 25 and the inter-pixel light shielding portion 29 are formed is obtained.

As described above, the solid-state imaging device 1 of the first embodiment includes the plurality of photoelectric conversion units 21 formed on the substrate 2 to generate signal charges according to the amount of incident light 24, the microlens array 33 including the microlens 17 formed for the photoelectric conversion unit group 23 including at least two or more adjacent photoelectric conversion units 21 to guide the incident light 24 to the photoelectric conversion unit group 23, and the scatterer 25 disposed on the optical path of the incident light 24 collected by the microlens 17, and the inter-pixel light shielding portion 29 including the groove 30 formed between the photoelectric conversion unit 21 of the photoelectric conversion unit group 23 and the photoelectric conversion unit 21 adjacent to the photoelectric conversion unit group 23 and the insulating material 31 filled in the groove 30. The opening side of the inner side surface of the groove 30 on the scatterer 25 side is a flat surface inclined so that the groove width becomes narrower toward the bottom of the groove 30. In this way, since the scatterer 25 is provided on the optical path of the incident light 24, the incident light 24 can be scattered by the scatterer 25 and the difference in signal charge (sensitivity difference between same colors) generated by the photoelectric conversion units 21 included in the same photoelectric conversion unit group 23 can be reduced. Since the opening side of the inner side surface of the groove 30 on the scatterer 25 side is inclined, the incidence angle of the scattered light 28 on the inter-pixel light shielding portion 29 can be increased on the opening side of the groove 30, the region where the scattered light 28 is totally reflected can be expanded, and color mixing between different colors can be suppressed. Therefore, it is possible to provide the solid-state imaging device 1 capable of suppressing color mixing between different colors while reducing the sensitivity difference between same colors.

In the solid-state imaging device 1 of the first embodiment, the bottom side of the inner side surface of the groove 30 on the scatterer 25 side has a flat surface formed so as to extend in the depth direction from the light receiving surface side of the substrate 2 so that the groove width is constant. Therefore, it is possible to suppress a decrease in the volume of the photoelectric conversion unit 21 adjacent to the inter-pixel light shielding portion 29, and suppress a decrease in the number of saturated electrons in the photoelectric conversion unit 21.

In the solid-state imaging device 1 of the first embodiment, the scatterer 25 is configured to include the scatterer groove 26 formed between the photoelectric conversion units 21 in the photoelectric conversion unit group 23 and the scatterer insulating material 27 filled in the scatterer groove 26. The two inner side surfaces of the scatterer groove 26 are flat surfaces formed so as to extend in the depth direction from the light receiving surface side of the substrate 2 so that the groove width is constant. Therefore, it is possible to suppress a decrease in the volume of the photoelectric conversion unit 21 adjacent to the scatterer 25, and suppress a decrease in the number of saturated electrons in the photoelectric conversion unit 21.

In the solid-state imaging device 1 of the first embodiment, the opening side of the inner side surface of the groove 30 on the scatterer 25 side is a flat surface inclined, with respect to the thickness direction of the substrate 2, at an angle equal to or higher than the critical angle which is a minimum incidence angle at which total reflection occurs when light is incident from the photoelectric conversion unit 21 to the inter-pixel light shielding portion 29. Therefore, the incidence angle of the scattered light 28 to the inter-pixel light shielding portion 29 on the opening side of the groove 30 can be set to be equal to or higher than the critical angle, the scattered light 28 can be totally reflected, and color mixing between different colors can be suppressed more reliably.

In the solid-state imaging device 1 of the first embodiment, the insulating material 31 is a silicon oxide. Moreover, the critical angle is 20.5°. Here, the minimum incidence angle at which total reflection occurs when light is incident from silicon to the silicon oxide film is 20.5°. Therefore, the scattered light 28 entering the inter-pixel light shielding portion 29 can be more reliably totally reflected on the opening side of the groove 30.

Figure 4:
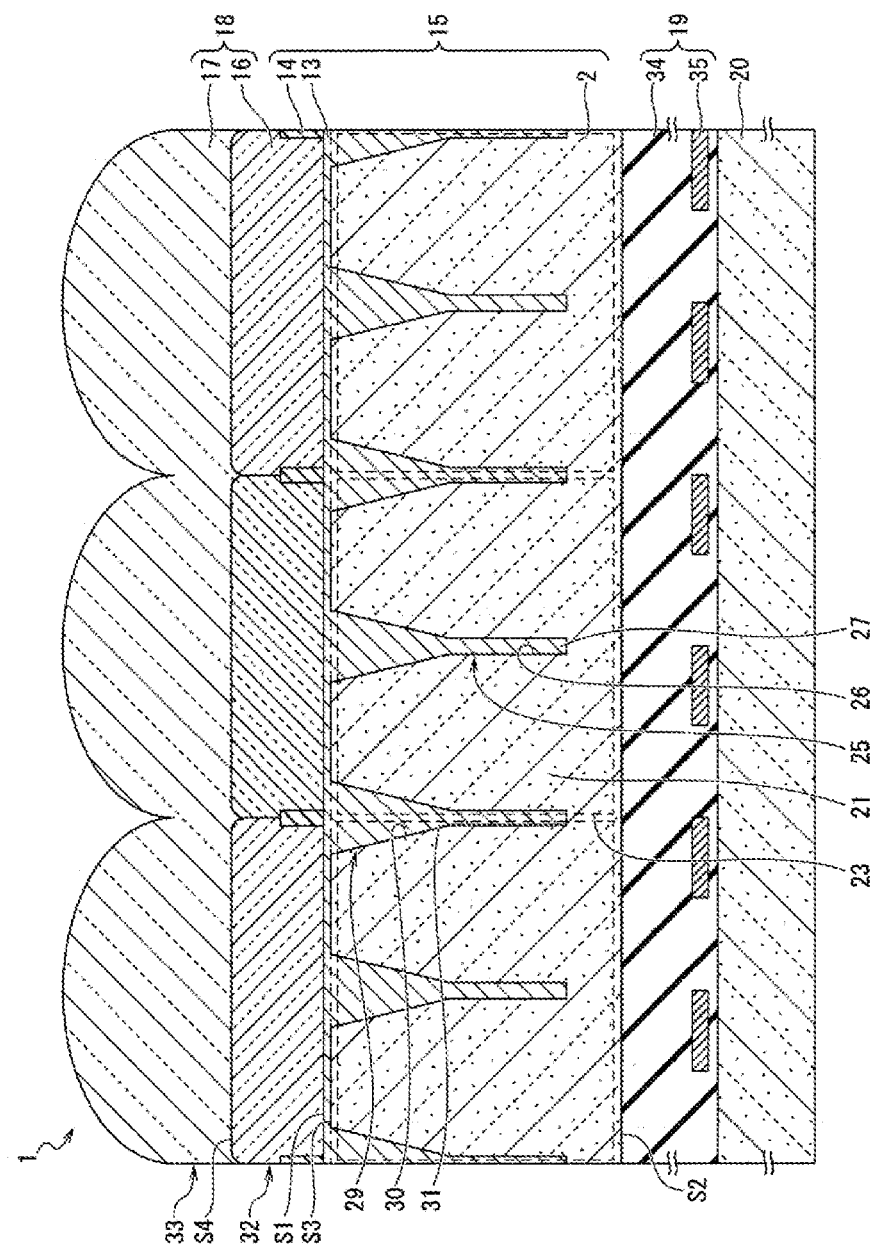
FIG. 4 is a cross-sectional diagram illustrating a configuration of a pixel region of the solid-state imaging device according to the second embodiment.

2. Second Embodiment: Solid-State Imaging Device 2-1 Configurations of Main Parts Next, a solid-state imaging device 1 according to the second embodiment of the present disclosure will be described. An overall structure of the solid-state imaging device according to the second embodiment is not shown because it is the same as in FIG. 1. FIG. 4 is a diagram illustrating a cross-sectional configuration of the solid-state imaging device 1 according to the second embodiment. In FIG. 4, parts corresponding to those in FIGS. 2A and 2B are given the same reference signs, and redundant descriptions thereof will not be given.

In the solid-state imaging device 1 according to the second embodiment, the configuration of the scatterer 25 is different from that of the solid-state imaging device 1 according to the first embodiment. In the second embodiment, as illustrated in FIG. 4, the shape of the scatterer groove 26 of the scatterer 25 is the same as the shape of the groove 30 of the inter-pixel light shielding portion 29.

That is, the opening side of the two inner side surfaces of the scatterer groove 26 is a flat surface inclined so that the groove width becomes narrower toward the bottom of the scatterer groove 26. The bottom side of the two inner side surfaces of the scatterer groove 26 is a flat surface formed so as to extend in the depth direction from the back surface S3 side (light receiving surface side) of the substrate 2 so that the groove width is constant. That is, the scatterer groove 26 has a two-stage structure of a tapered shape and a straight shape, similarly to the groove 30.

2-2 Method of Forming Scatterer and Inter-Pixel Light Shielding Portion

Next, a method of forming the scatterer 25 and the inter-pixel light shielding portion 29 in the solid-state imaging device 1 of the second embodiment will be described.

Figure 5A:
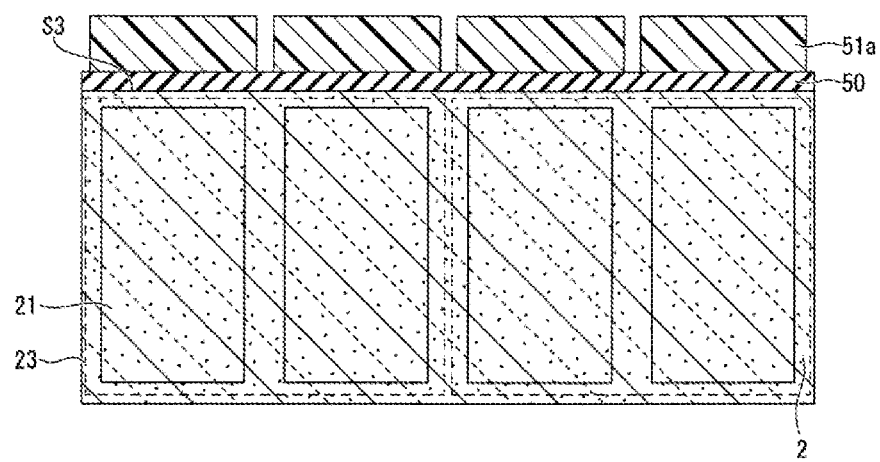
FIG. 5A is an explanatory diagram illustrating a method of forming a scatterer and an inter-pixel light shielding portion.
Figure 5B:
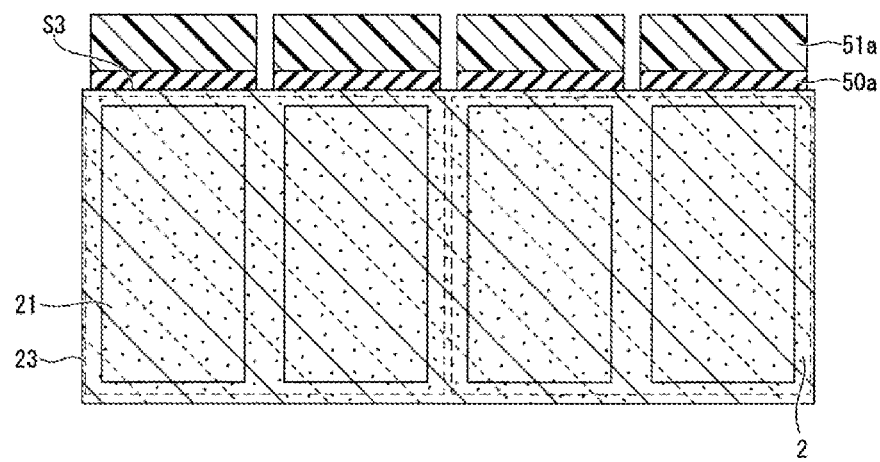
FIG. 5B is an explanatory diagram illustrating a method of forming a scatterer and an inter-pixel light shielding portion.
Figure 5C:
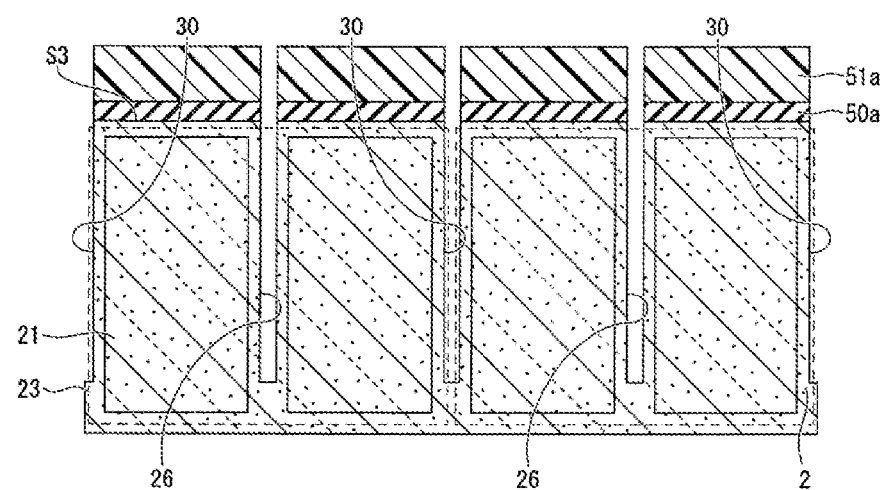
FIG. 5C is an explanatory diagram illustrating a method of forming a scatterer and an inter-pixel light shielding portion.

First, as illustrated in FIG. 3A, a hard mask layer 50 and a resist layer 51 are formed on the back surface S3 of the substrate 2 in that order, as in the method of forming the scatterer 25 and the inter-pixel light shielding portion 29 of the first embodiment. Subsequently, as illustrated in FIG. 5A, the resist layer 51 is exposed and developed to form a mask 51a having a grid-like opening at a position where the scatterer groove 26 and the groove 30 are to be formed. The width of the opening at the position where the groove 30 is to be formed is the same as the width on the bottom side of the groove 30. Subsequently, as illustrated in FIG. 5B, the hard mask layer 50 is etched using the formed mask 51a to form a hard mask 50a. In this way, the pattern shape of the hard mask 50a becomes the same as the pattern shape of the mask 51a. Subsequently, as illustrated in FIG. 5C, after removing the mask 51a from the formed hard mask 50a, dry etching is performed using the hard mask 50a to form the scatterer groove 26 and the groove 30 on the substrate 2. In this way, a straight scatterer groove 26 and a groove 30 are formed.

Figure 5D:
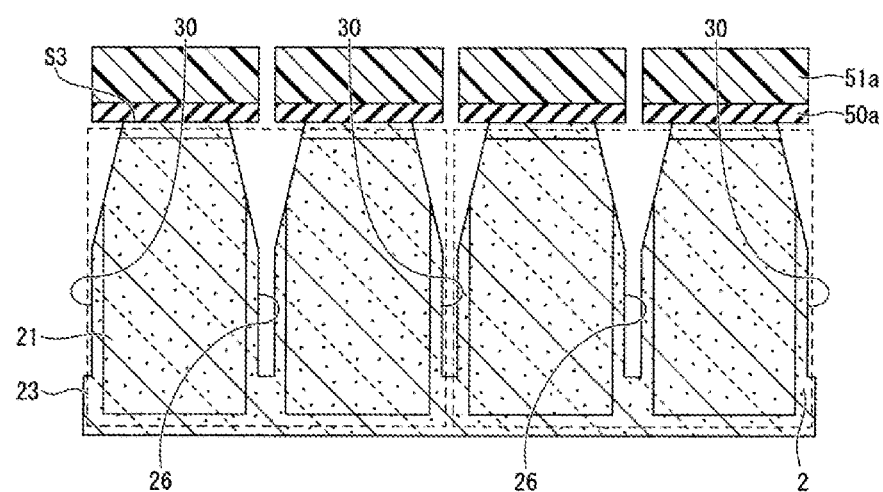
FIG. 5D is an explanatory diagram illustrating a method of forming a scatterer and an inter-pixel light shielding portion.
Figure 5E:
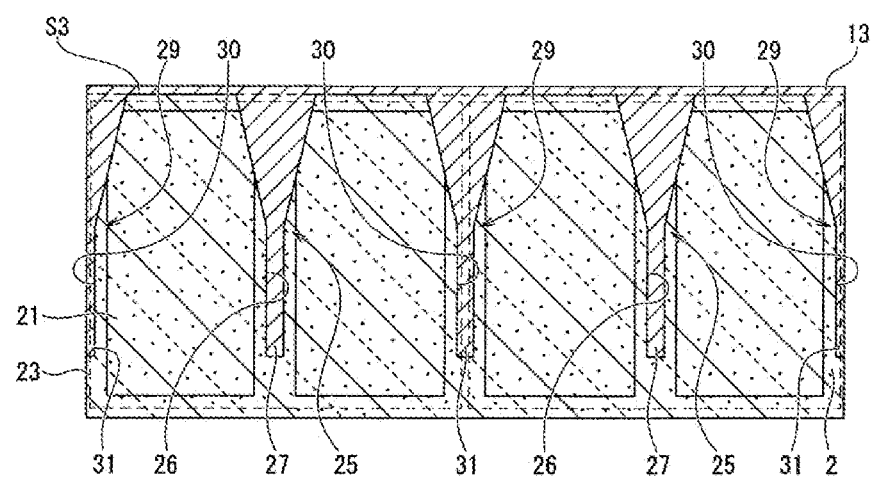
FIG. 5E is an explanatory diagram illustrating a method of forming a scatterer and an inter-pixel light shielding portion.

Subsequently, as illustrated in FIG. 5D, wet etching is performed using the hard mask 52a to form a tapered inner side surface of the scatterer groove 26 and the groove 30 on the opening side. In this way, a scatterer groove 26 and a groove 30 having a two-stage structure of a tapered shape and a straight shape is obtained. Subsequently, as illustrated in FIG. 5E, after the hard mask 52a is removed from the substrate 2, the scatterer groove 26 is filled with the scatterer insulating material 27 and the groove 30 is filled with the insulating material 31 using a CVD method or the like. In this way, the substrate 2 on which the scatterer 25 and the inter-pixel light shielding portion 29 are formed is obtained.

As described above, in the solid-state imaging device 1 of the second embodiment, since the scatterer groove 26 of the scatterer 25 has the same shape as the groove 30 of the inter-pixel light shielding portion 29, the scatterer 25 and the inter-pixel light shielding portion 29 can be formed in the same process, and the scatterer 25 and the inter-pixel light shielding portion 29 can be easily formed.

If the opening side of the scatterer groove 26 has a tapered shape (that is, a shape in which the groove width becomes narrower toward the opening of the scatterer groove 26), the opening area of the photoelectric conversion unit 21 becomes narrower, and the amount of charge that can be accumulated in the vicinity of the opening of the photoelectric conversion unit 21 is reduced. However, since the signal charge generated in the vicinity of the opening is relatively small, the effect of reducing the amount of charge that can be accumulated in the vicinity of the opening is relatively small.

Figure 6A:
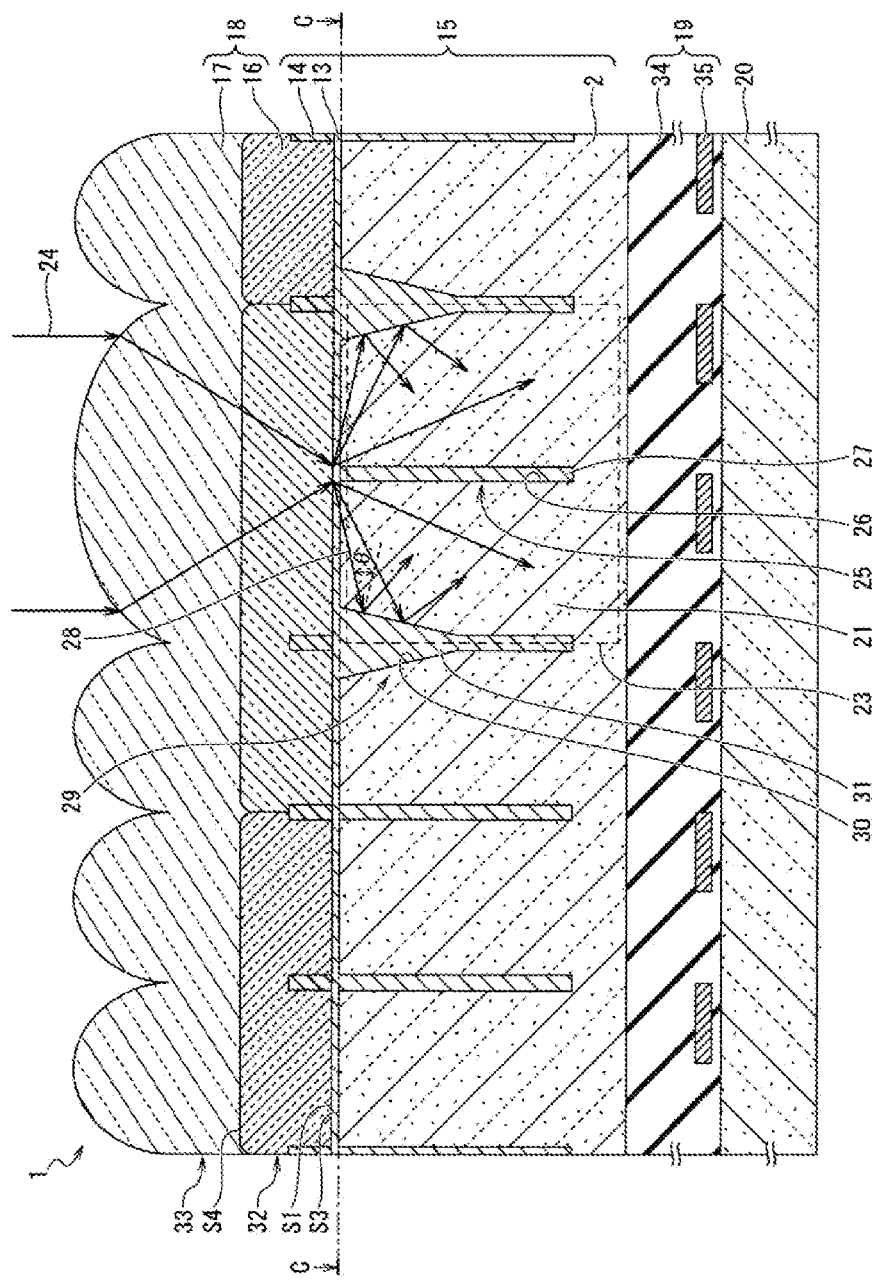
FIG. 6A is a cross-sectional diagram illustrating a configuration of a pixel region of a solid-state imaging device according to a modification example.
Figure 6B:
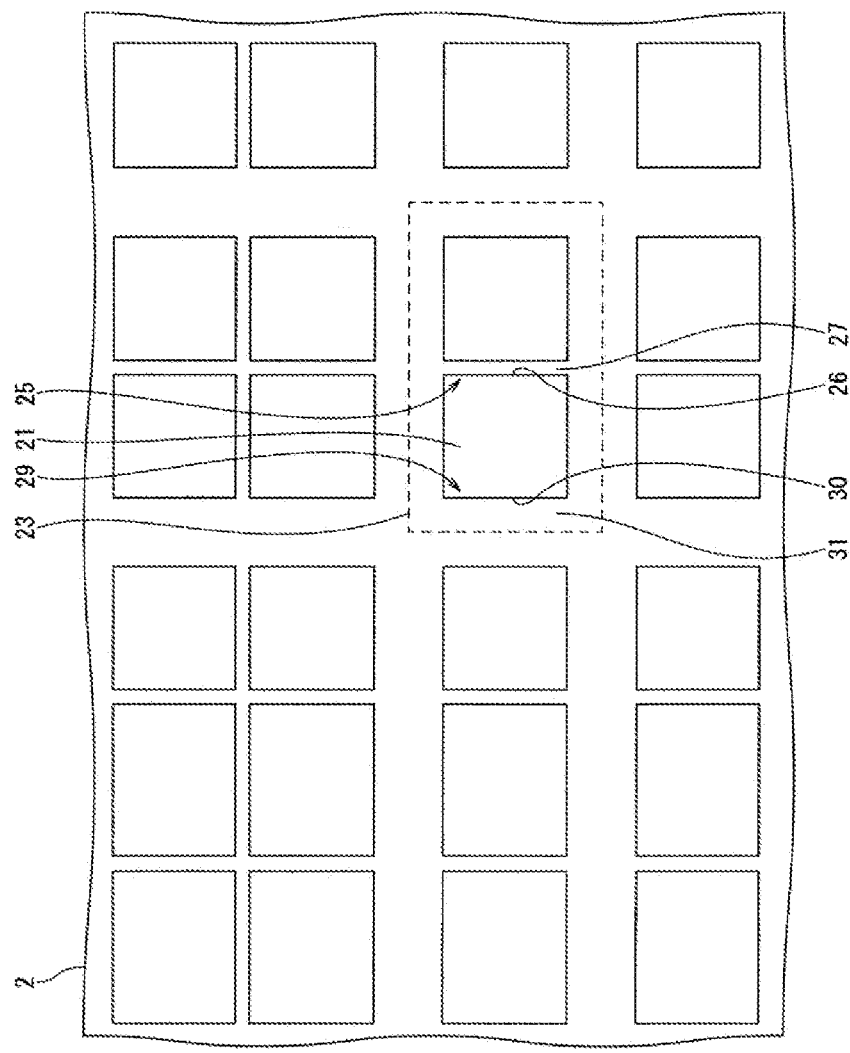
FIG. 6B is a cross-sectional diagram illustrating a configuration of a pixel region along line C-C in FIG. 6A.

2-3 Modification Example (1) In the solid-state imaging device 1 according to the first and second embodiments, an example in which the photoelectric conversion unit group 23 is composed of four photoelectric conversion units 21 having 2 rows and 2 columns is illustrated, but another configuration can be adopted. For example, as illustrated in FIGS. 6A and 6B, the photoelectric conversion unit group 23 may be composed of two photoelectric conversion units 21 having 2 rows and 1 column. Only a part of the photoelectric conversion units 21 is used to form the two photoelectric conversion unit group 23 having 2 rows and 1 column. One microlens 17 is formed for one photoelectric conversion unit 21 in the photoelectric conversion units 21 that do not constitute the photoelectric conversion unit group 23.

Figure 7:
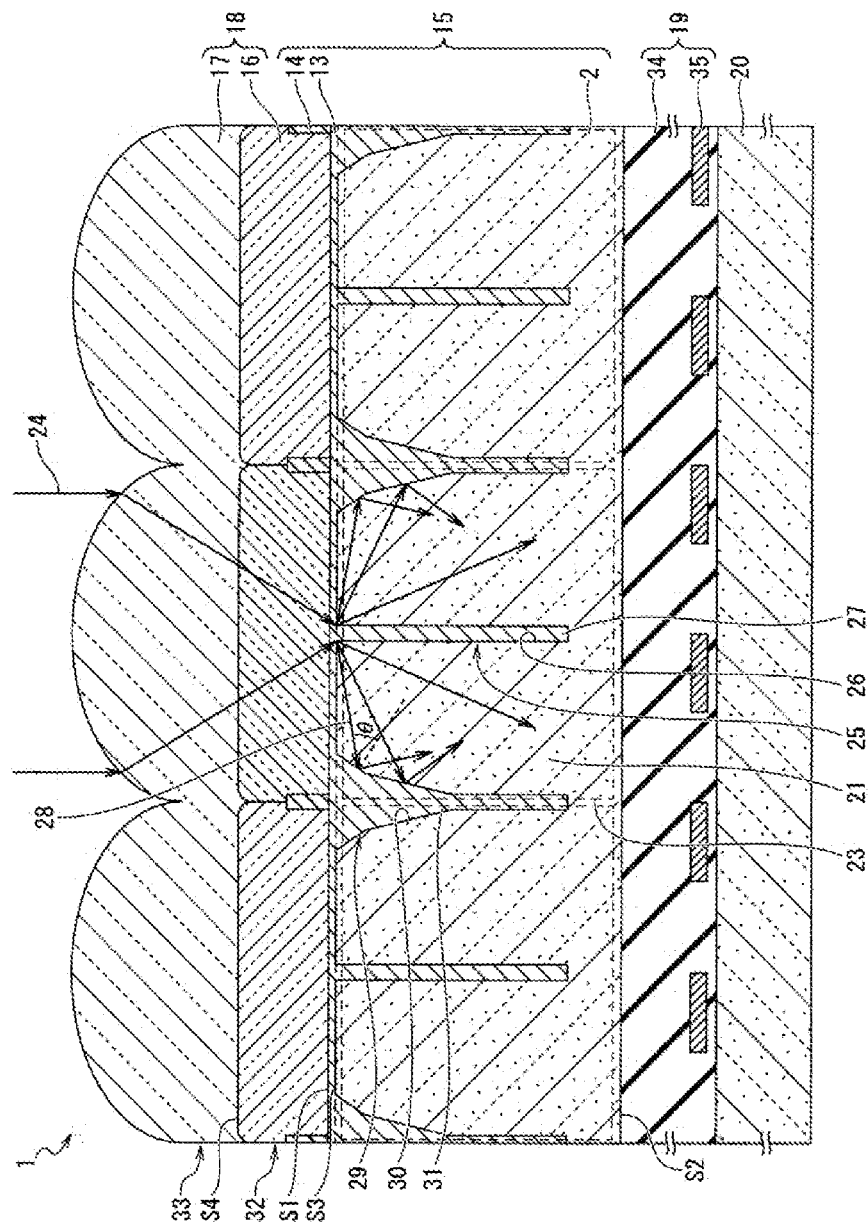
FIG. 7 is a cross-sectional diagram illustrating a configuration of a pixel region of a solid-state imaging device according to a modification example.
Figure 8:
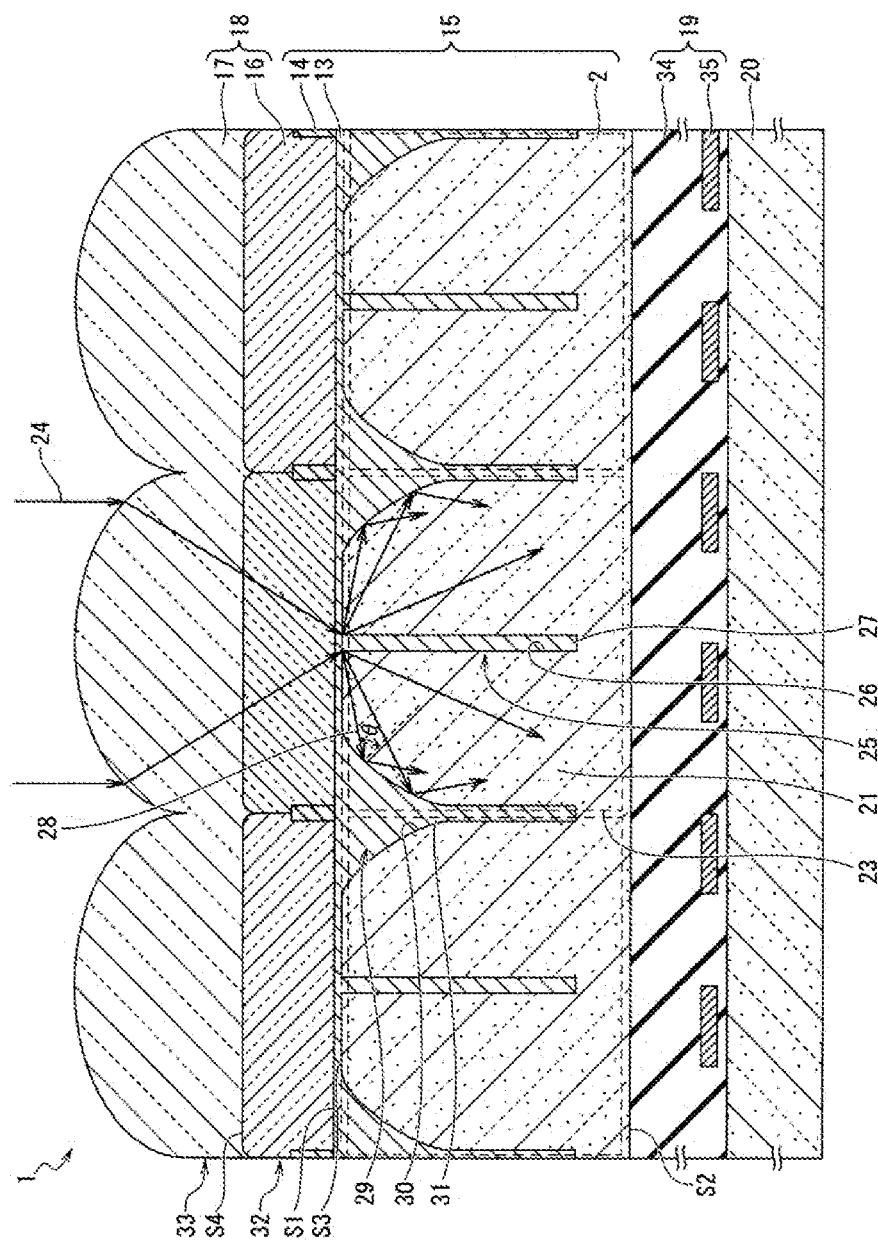
FIG. 8 is a cross-sectional diagram illustrating a configuration of a pixel region of a solid-state imaging device according to a modification example.
Figure 9:
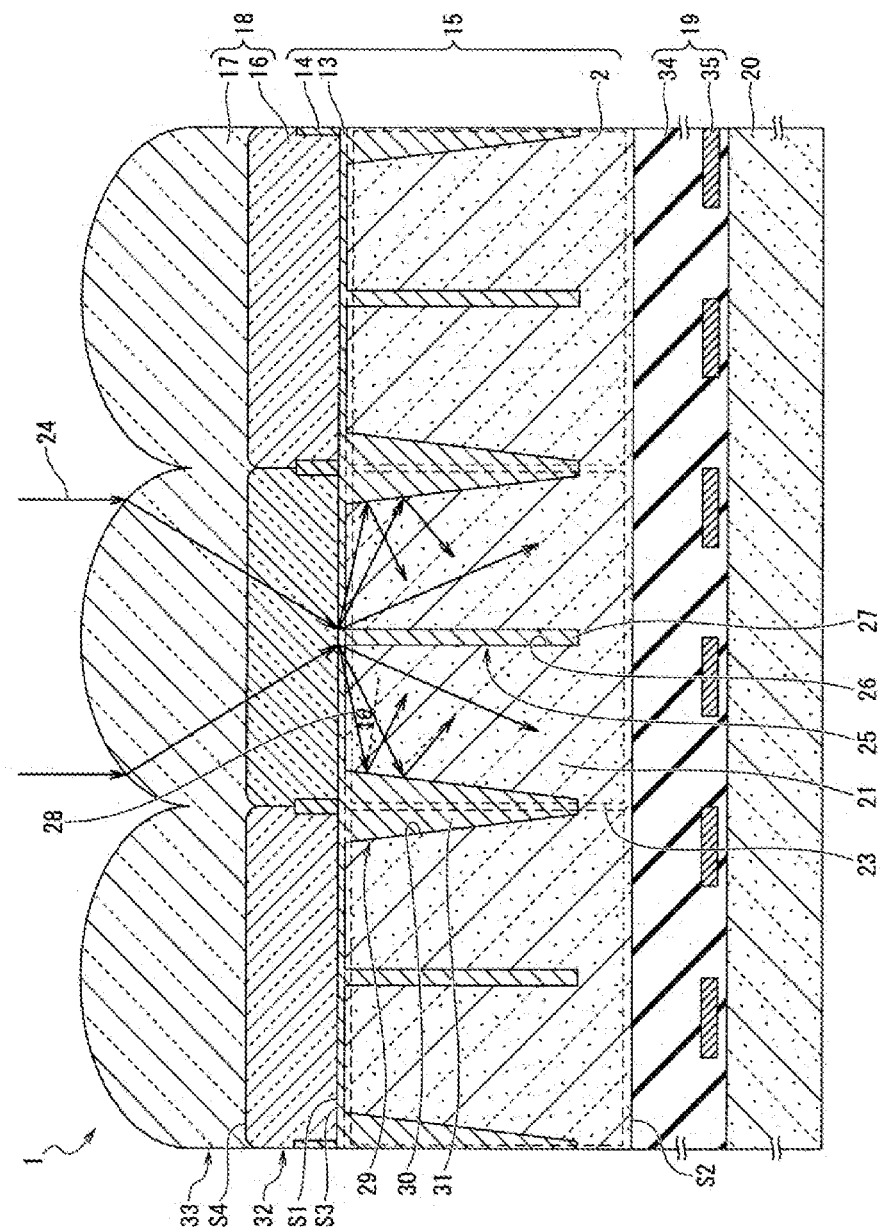
FIG. 9 is a cross-sectional diagram illustrating a configuration of a pixel region of a solid-state imaging device according to a modification example.

(2) In the solid-state imaging device 1 according to the first embodiment, an example in which each of the opening sides of the two inner side surfaces of the groove 30 is a flat surface inclined so that the groove width becomes narrower toward the bottom of the groove 30 is illustrated, but another configuration can be adopted. For example, as illustrated in FIG. 7, each of the opening sides of the two inner side surfaces of the groove 30 may be a plurality of stages of flat surfaces inclined so that the groove width becomes narrower toward the bottom of the groove 30. FIG. 7 illustrates a case where the opening side of the inner side surface of the groove 30 is a two-stage flat surface. For example, as illustrated in FIG. 8, the opening side of the two inner side surfaces of the groove 30 may be a curved surface curved so that the groove width becomes narrower toward the bottom of the groove 30. For example, as illustrated in FIG. 9, the entire two inner side surfaces of the groove 30 may be a flat surface inclined so that the groove width becomes narrower toward the bottom of the groove 30.

Figure 10:
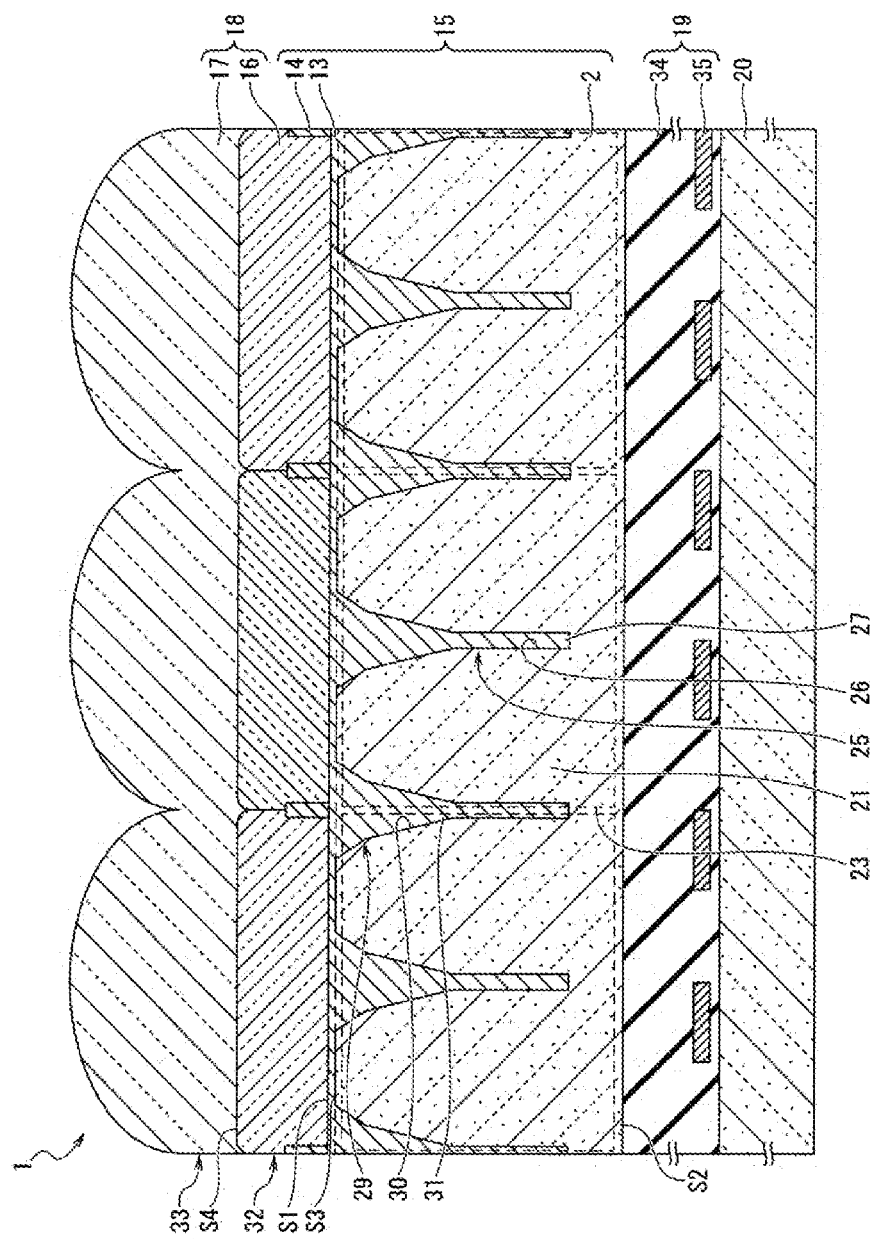
FIG. 10 is a cross-sectional diagram illustrating a configuration of a pixel region of a solid-state imaging device according to a modification example.
Figure 11:
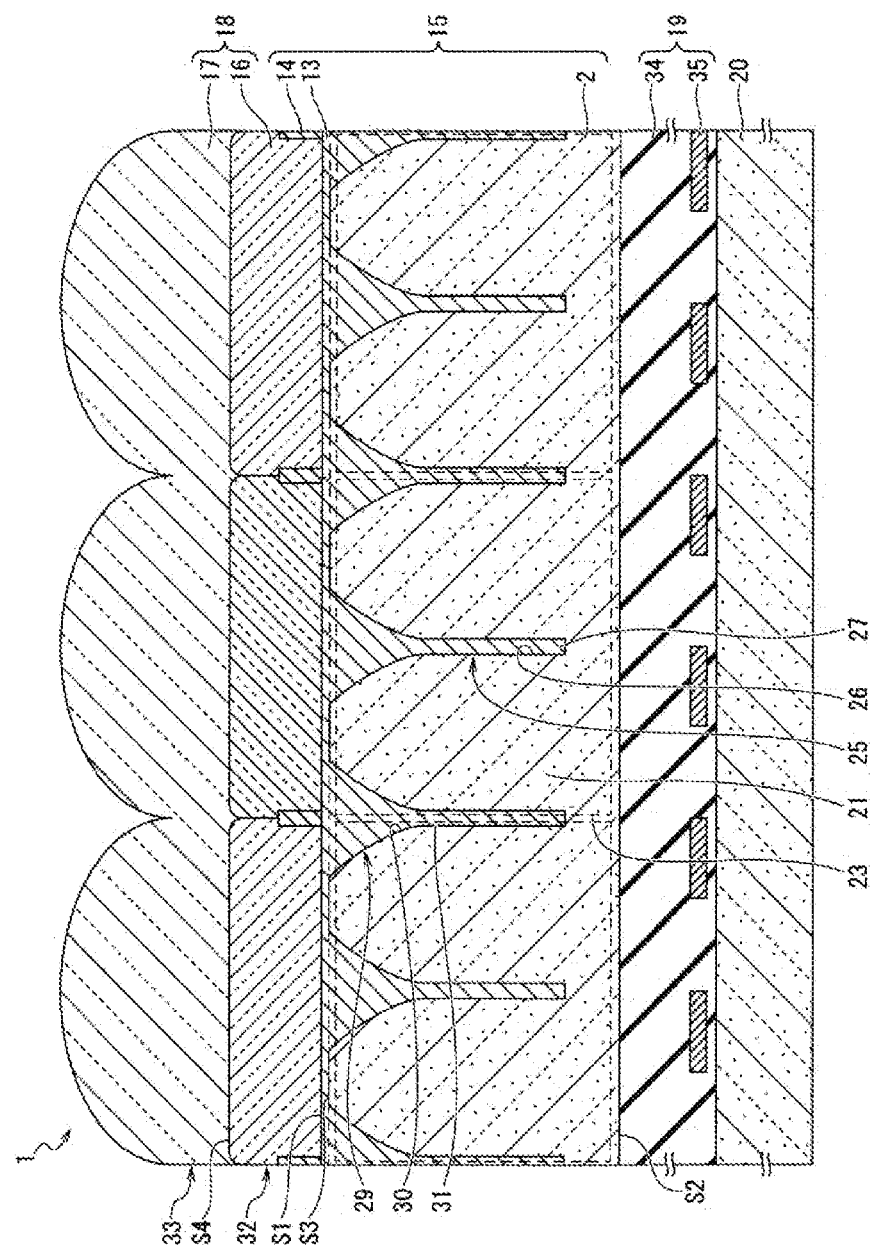
FIG. 11 is a cross-sectional diagram illustrating a configuration of a pixel region of a solid-state imaging device according to a modification example.
Figure 12:
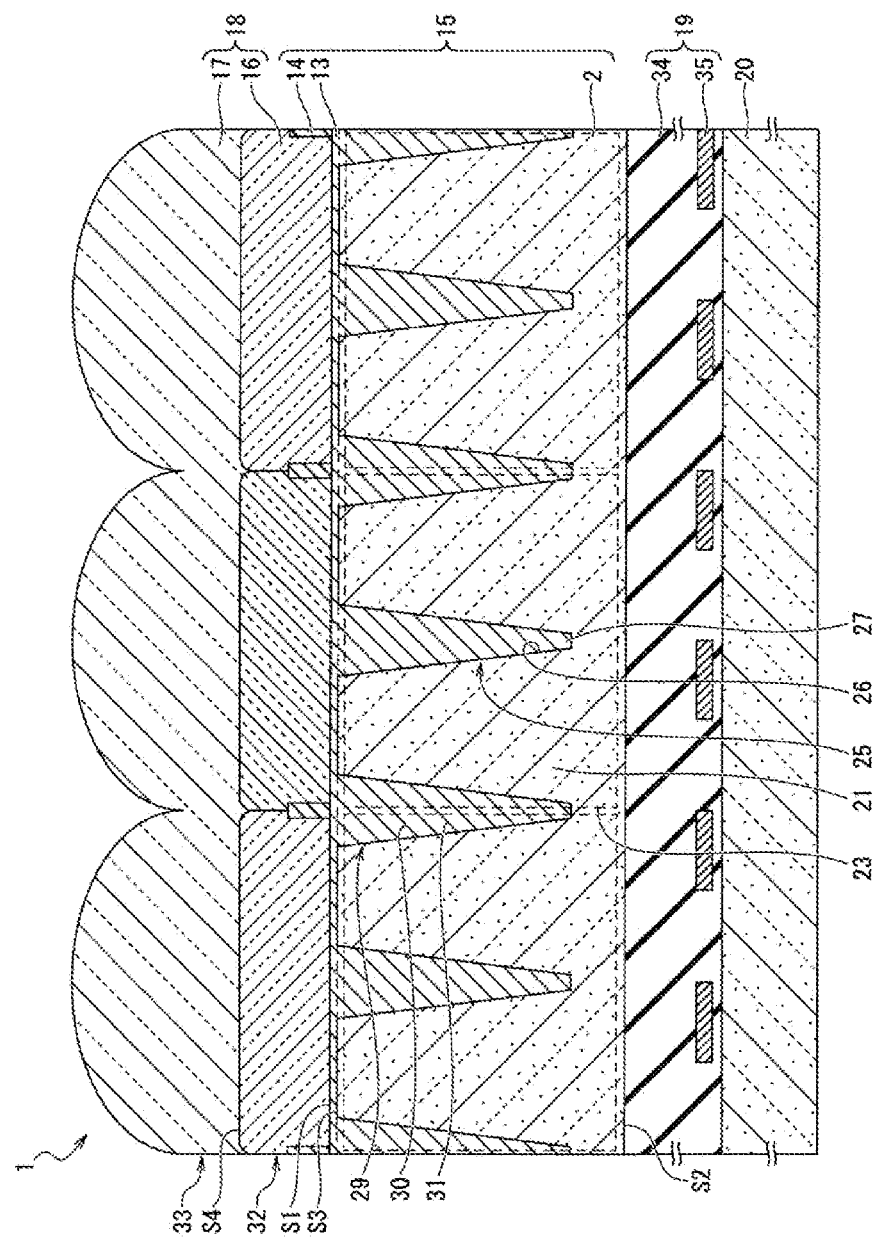
FIG. 12 is a cross-sectional diagram illustrating a configuration of a pixel region of a solid-state imaging device according to a modification example.

The same configuration can be adopted for the solid-state imaging device 1 according to the second embodiment. For example, as illustrated in FIG. 10, each of the opening sides of the two inner side surfaces of the groove 30 of the inter-pixel light shielding portion 29 may be a plurality of stages of flat surfaces inclined so that the groove width becomes narrower toward the bottom of the groove 30, and each of the opening sides of the two inner side surfaces of the scatterer groove 26 of the scatterer 25 may be a plurality of stages of flat surfaces inclined so that the groove width becomes narrower toward the bottom of the scatterer groove 26. FIG. 10 illustrates a case where the opening side of the inner side surface of the groove 30 and the scatterer groove 26 is a two-stage flat surface. For example, as illustrated in FIG. 11, the opening side of the two inner side surfaces of the groove 30 of the inter-pixel light shielding portion 29 may be a curved surface curved so that the groove width becomes narrower toward the bottom of the groove 30, and the opening side of the two inner side surfaces of the scatterer groove 26 of the scatterer 25 may be a curved surface curved so that the groove width becomes narrower toward the bottom of the scatterer groove 26. For example, as illustrated in FIG. 12, the entire two inner side surfaces of the groove 30 of the inter-pixel light shielding portion 29 may be a flat surface inclined so that the groove width becomes narrower toward the bottom of the groove 30, and the entire two inner side surfaces of the scatterer groove 26 of the scatterer 25 may be a flat surface inclined so that the groove width becomes narrower toward the bottom of the scatterer groove 26. When the inner side surface of the groove 30 or the like is a curved surface, the opening side of the inner side surface of the groove 30 on the scatterer 25 side may be a curved surface whose angle with respect to the thickness direction of the substrate 2 becomes smaller toward the bottom of the groove 30. By doing so, the incidence angle θ of the scattered light 28 in the vicinity of the back surface S3 (near the light receiving surface) of the substrate 2 can be increased, the region where the scattered light 28 is totally reflected can be expanded, and color mixing between different colors can be suppressed.

Figure 13:
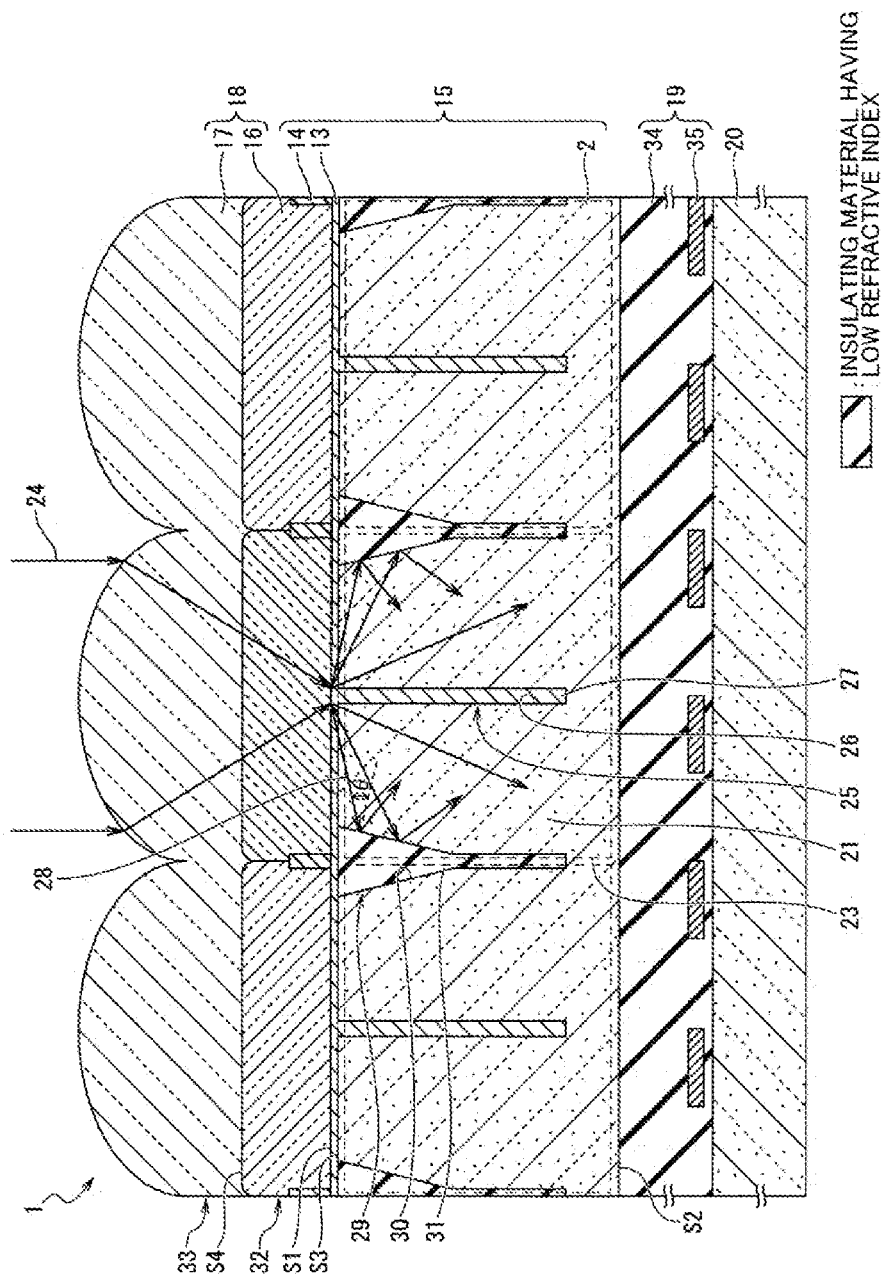
FIG. 13 is a cross-sectional diagram illustrating a configuration of a pixel region of a solid-state imaging device according to a modification example.
Figure 14:
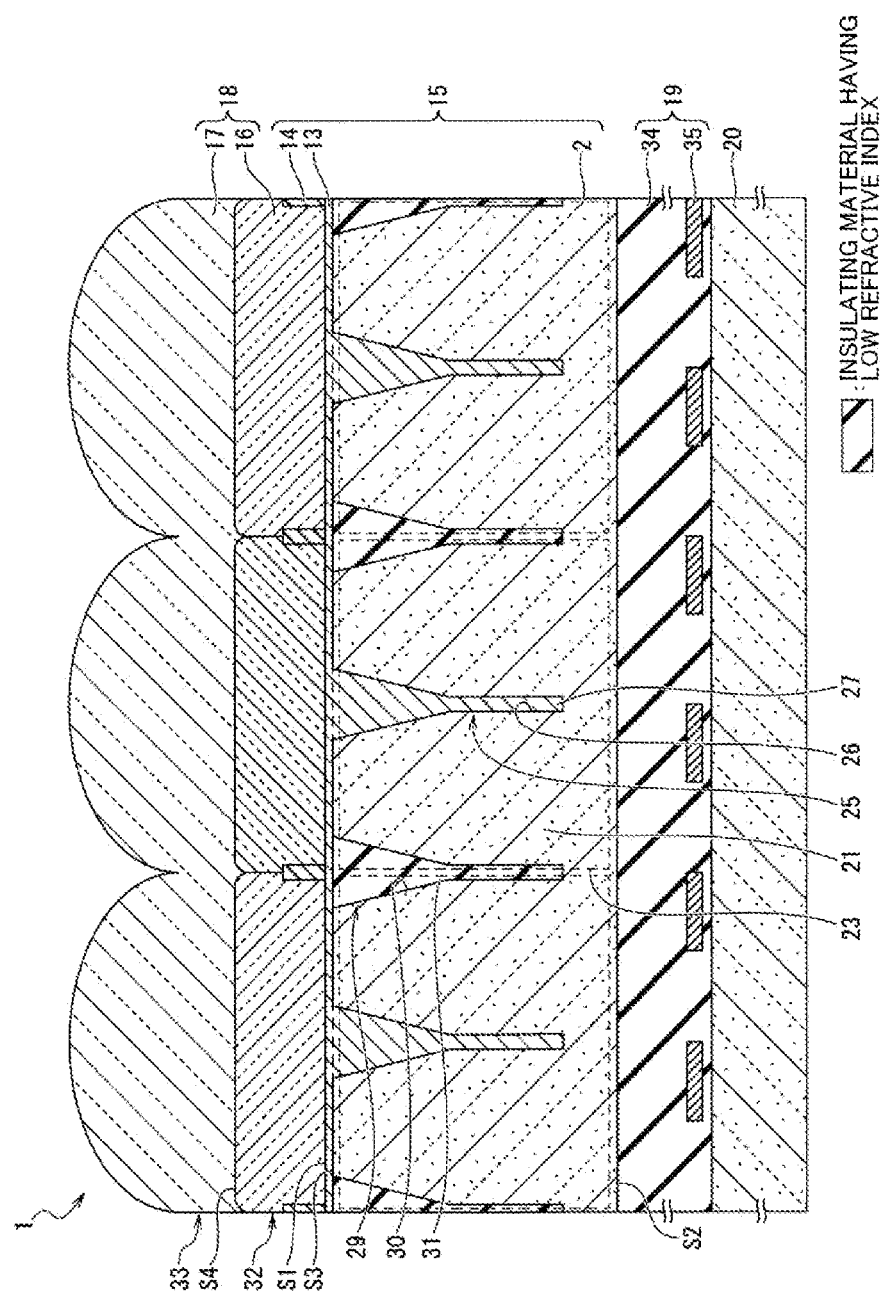
FIG. 14 is a cross-sectional diagram illustrating a configuration of a pixel region of a solid-state imaging device according to a modification example.

(3) In the solid-state imaging device 1 according to the first and second embodiments, an example in which the insulating material 31 of the inter-pixel light shielding portion 29 is the same insulating material as the scatterer insulating material 27 of the scatterer 25 is illustrated, but another configuration can be adopted. For example, as illustrated in FIGS. 13 and 14, the insulating material 31 of the inter-pixel light shielding portion 29 may be an insulating material having a refractive index lower than that of the scatterer insulating material 27 of the scatterer 25. As the insulating material having a low refractive index, for example, titanium nitride (TiN), magnesium fluoride ($MgF_2$), lithium fluoride (LiF), calcium fluoride ($CaF_2$), air, and a low refractive index resin can be adopted. Examples of the low refractive index resin include resins having a refractive index smaller than the refractive index (n=1.45) of silicon oxide ($SiO_2$). FIG. 13 illustrates a case where it is applied to the solid-state imaging device 1 according to the first embodiment. FIG. 14 illustrates a case where it is applied to the solid-state imaging device 1 according to the second embodiment. As compared with the case of using an insulating material with a high refractive index, using an insulating material with a low refractive index, the critical angle at which total reflection occurs when the scattered light 28 is incident from the photoelectric conversion unit 21 to the inter-pixel light shielding portion 29 can be reduced, the region where the scattered light 28 is totally reflected can be expanded, and the color mixing between different colors can be suppressed more reliably.

Figure 15:
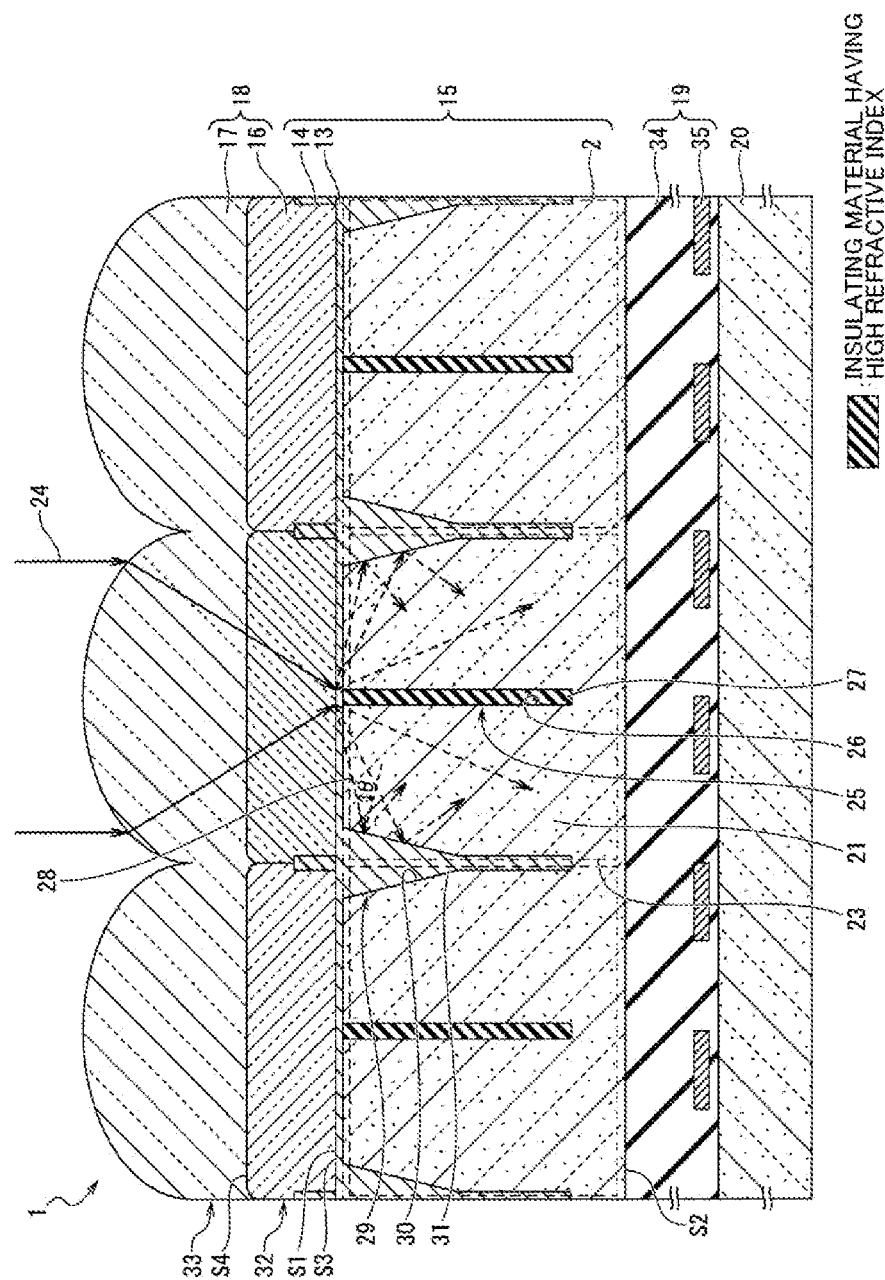
FIG. 15 is a cross-sectional diagram illustrating a configuration of a pixel region of a solid-state imaging device according to a modification example.
Figure 16:
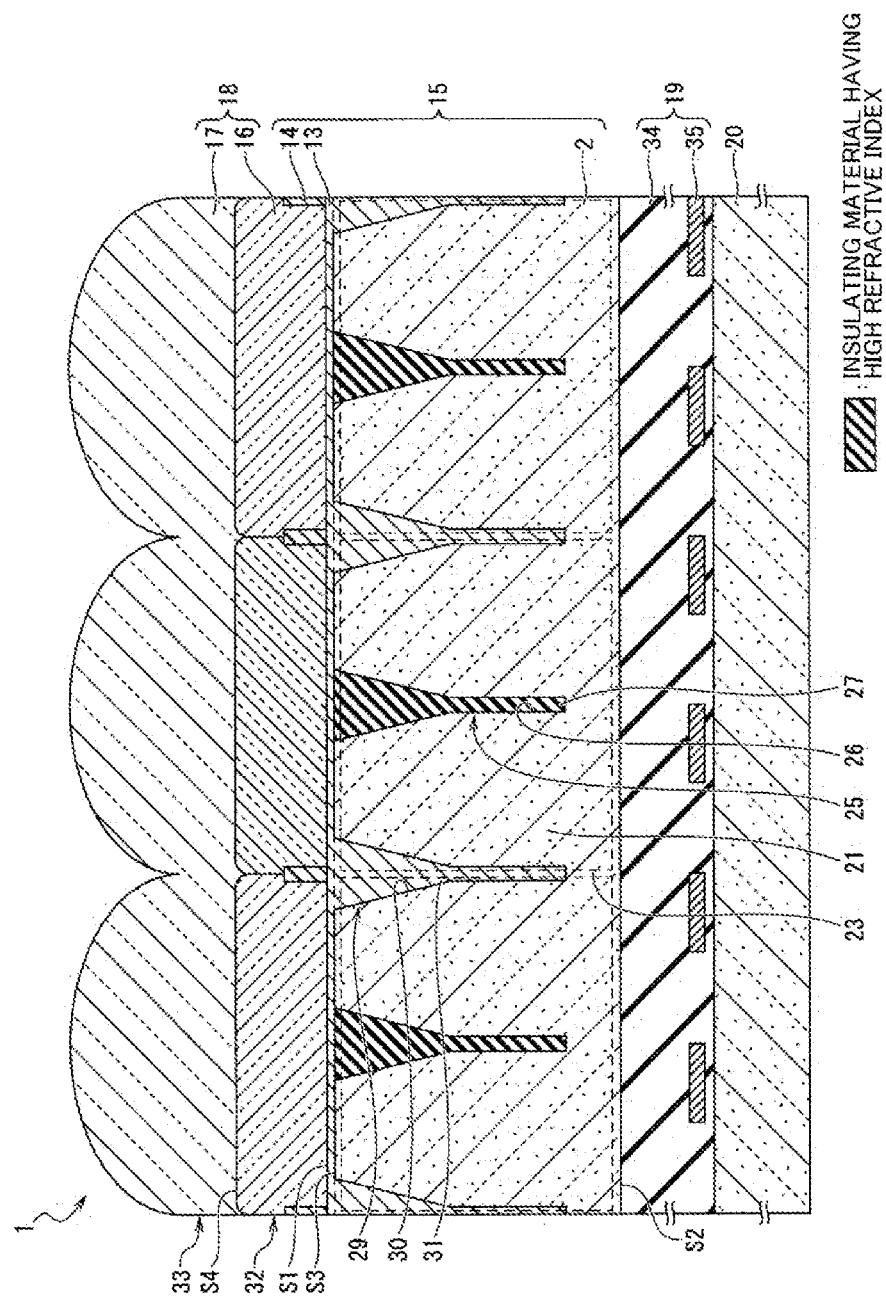
FIG. 16 is a cross-sectional diagram illustrating a configuration of a pixel region of a solid-state imaging device according to a modification example.

For example, as illustrated in FIGS. 15 and 16, the scatterer insulating material 27 of the scatterer 25 may be an insulating material having a high refractive index. As the insulating material having a high refractive index, an insulating material having a higher refractive index than the silicon (Si) constituting the substrate 2 can be adopted. Examples thereof include titanium oxide ($TiO_2$), silicon nitride (SiN), zirconium oxide ($ZrO_2$), hafnium oxide ($HfO_2$), tantalum oxide ($Ta_2O_3$), zinc oxide (ZnO) and high refractive index resins. Examples of the high refractive index resin include resins having a refractive index higher than the refractive index (n=1.45) of silicon oxide ($SiO_2$). As compared with the case of using an insulating material having a low refractive index, using an insulating material having a high refractive index, the intensity of the scattered light 28 can be reduced. FIG. 15 illustrates a case where it is applied to the solid-state imaging device 1 according to the first embodiment. FIG. 16 illustrates a case where it is applied to the solid-state imaging device 1 according to the second embodiment. Therefore, it is possible to reduce the intensity of the scattered light 28 incident on the inter-pixel light shielding portion 29, and more reliably reduce the color mixing between different colors.

Figure 17:
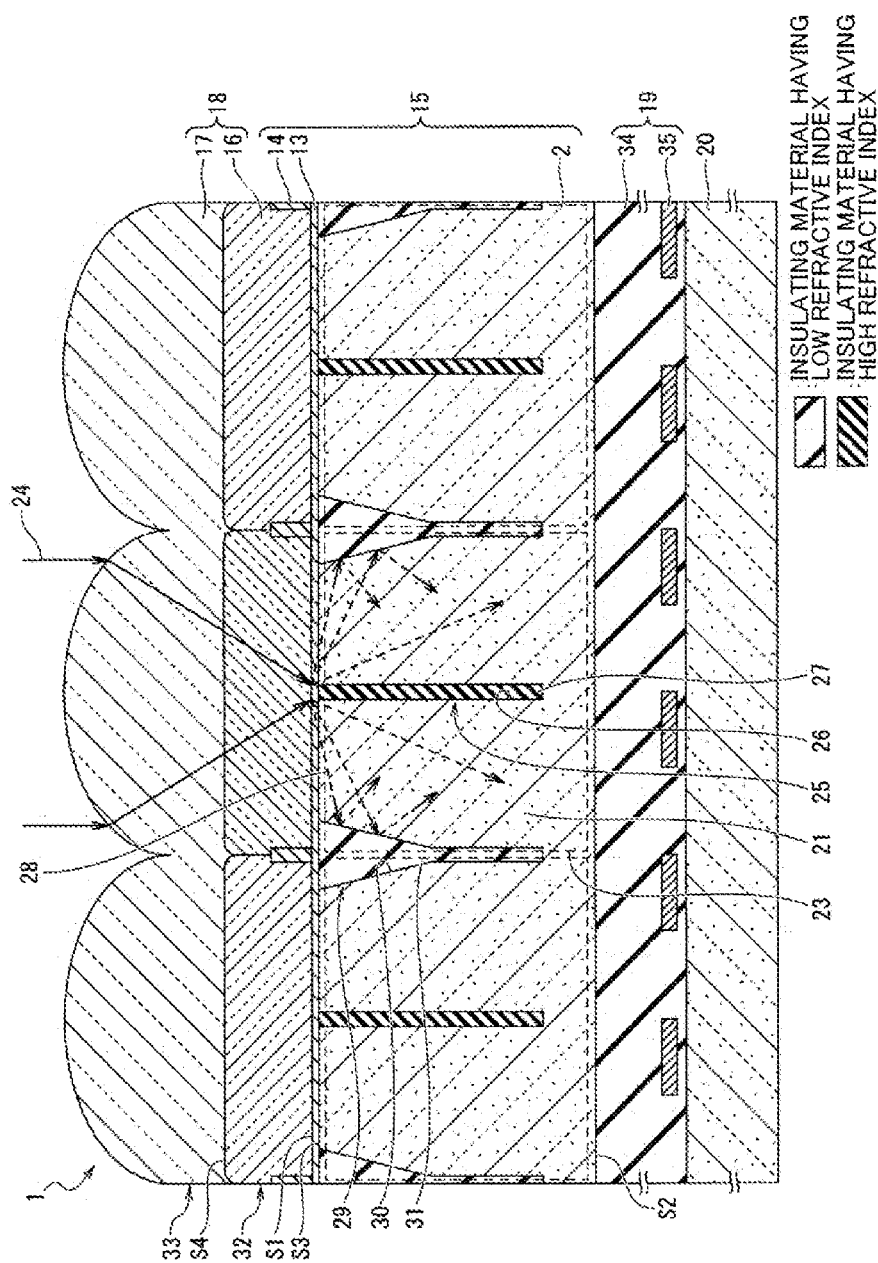
FIG. 17 is a cross-sectional diagram illustrating a configuration of a pixel region of a solid-state imaging device according to a modification example.
Figure 18:
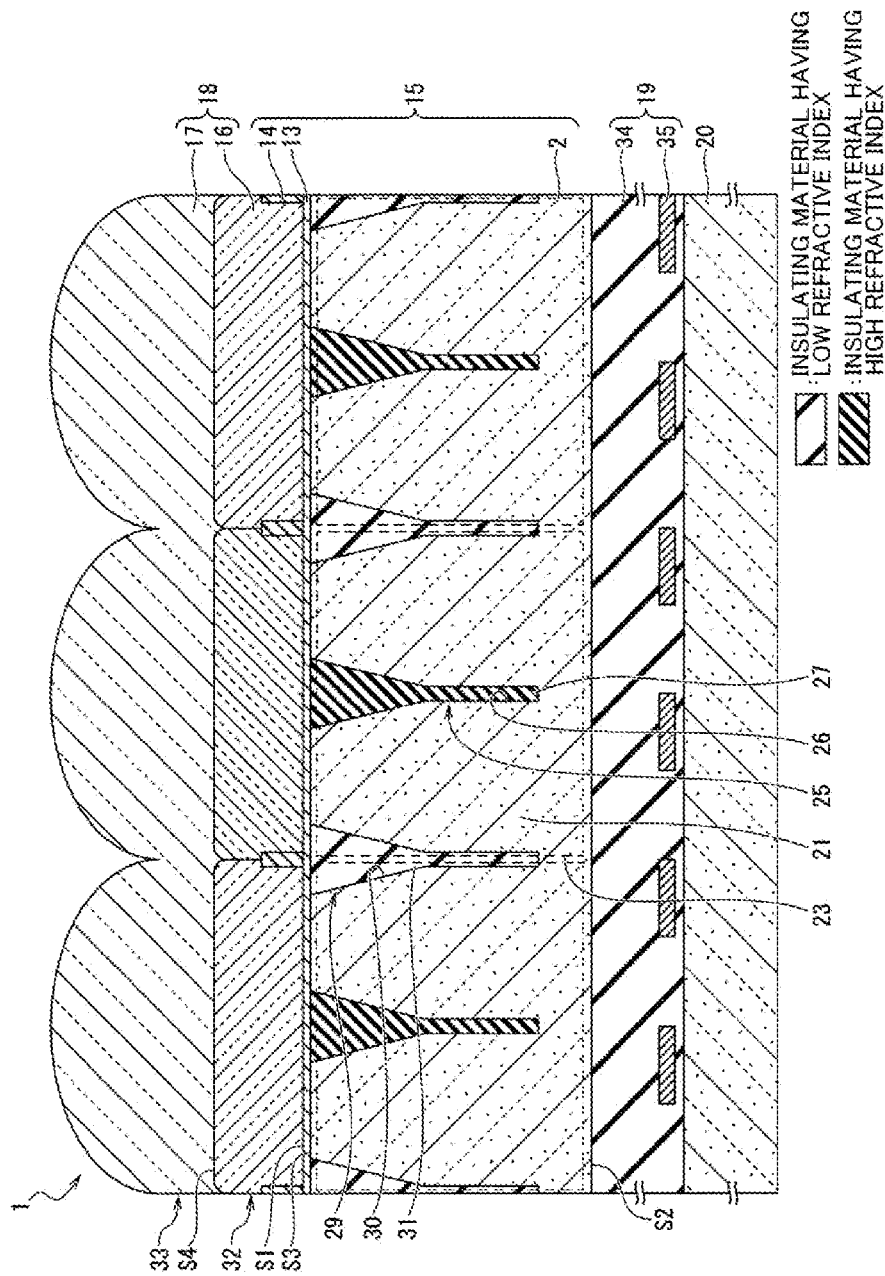
FIG. 18 is a cross-sectional diagram illustrating a configuration of a pixel region of a solid-state imaging device according to a modification example.

For example, as illustrated in FIGS. 17 and 18, the insulating material 31 of the inter-pixel light shielding portion 29 may be an insulating material having a refractive index lower than that of the scatterer insulating material 27 of the scatterer 25, and the scatterer insulating material 27 of the scatterer 25 may be an insulating material having a high refractive index. FIG. 17 illustrates a case where it is applied to the solid-state imaging device 1 according to the first embodiment. FIG. 18 illustrates a case where it is applied to the solid-state imaging device 1 according to the second embodiment.

Figure 19:
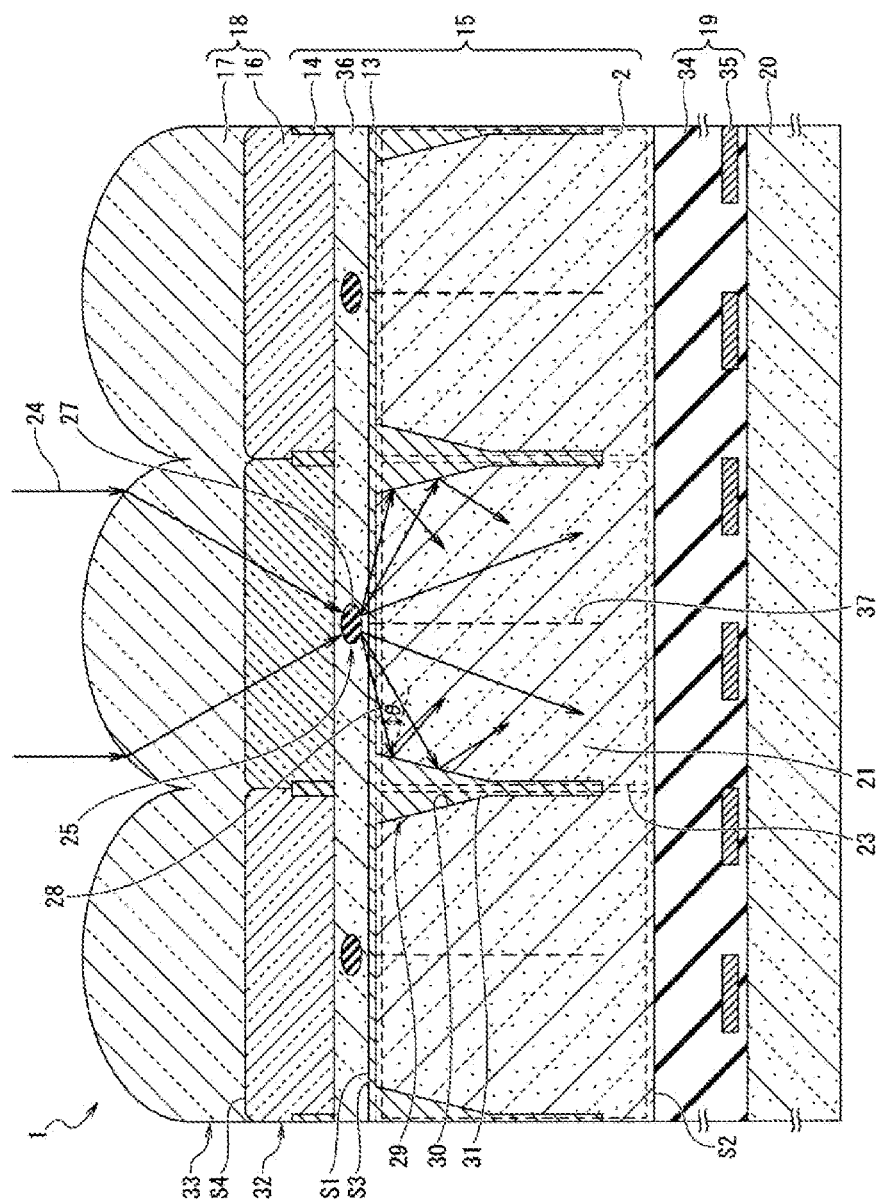
FIG. 19 is a cross-sectional diagram illustrating a configuration of a pixel region of a solid-state imaging device according to a modification example.

(4) In the solid-state imaging device 1 according to the first embodiment, an example in which the scatterer 25 is formed between the photoelectric conversion units 21 constituting the photoelectric conversion unit group 23 is illustrated, but another configuration can be adopted. For example, as illustrated in FIG. 19, an intermediate layer 36 may be formed between the color filter 16 and the substrate 2, and an oblate spherical scatterer 25 may be formed on the optical path of the incident light 24 collected by the microlens 17 in the intermediate layer 36. When the oblate spherical scatterer 25 is provided, an impurity layer 37 in which impurities are injected into the substrate 2 is formed between the photoelectric conversion units 21 constituting the photoelectric conversion unit group 23. As the impurities, for example, phosphorus, arsenic, boron, and the like can be adopted.

3. Application Example to Electronic Device

The technology according to the present disclosure (the present technology) may be applied to various electronic devices, for example, an imaging device such as a digital still camera and a digital video camera, a mobile phone having an imaging function, or another device having an imaging function.

FIG. 20 is a diagram showing an example of a schematic configuration of an electronic device (for example, a camera) to which the technology according to the present disclosure (the present technology) can be applied.

As illustrated in FIG. 20, the electronic device 100 includes a solid-state imaging device 101, an optical lens 102, a shutter device 103, a driving circuit 104, and a signal processing circuit 105.

The optical lens 102 forms an image of image light (incident light 106) from a subject on an imaging surface of the solid-state imaging device 101. Thereby, signal charges are accumulated in the solid-state imaging device 101 for a certain period. The shutter device 103 controls a light irradiation period and a light shielding period for the solid-state imaging device 101. The driving circuit 104 supplies a driving signal for controlling a transfer operation of the solid-state imaging device 101 and a shutter operation of the shutter device 103. An operation of transferring a signal to the solid-state imaging device 101 is performed by the driving signal (timing signal) supplied from the driving circuit 104. The signal processing circuit 105 performs various signal processing on signals (pixel signals) output from the solid-state imaging device 101. A video signal having been subjected to signal processing is stored in a storage medium such as a memory or is output to a monitor.

Note that the electronic device 100 to which the solid-state imaging device 1 can be applied is not limited to a camera, and the solid-state imaging device 1 can also be applied to other electronic device. The solid-state imaging device 1 may be applied to an imaging device such as a camera module for mobile device such as a mobile phone or a tablet terminal.

An example of the electronic device to which the technology according to the present disclosure can be applied has been described above. The technology according to the present disclosure can be applied to the solid-state imaging device 101 within the configuration described above. Specifically, the solid-state imaging device 1 in FIG. 1 can be applied to the solid-state imaging device 101. When the technology according to the present disclosure is applied to the solid-state imaging device 101, a better captured image can be obtained.

4. Application Example to Moving Body

The technology (present technology) according to the present disclosure may be realized as a device mounted on any type of moving body such as an automobile, an electric vehicle, a hybrid electric vehicle, a motorcycle, a bicycle, a personal mobility, an airplane, a drone, a ship, and a robot.

Figure 21:
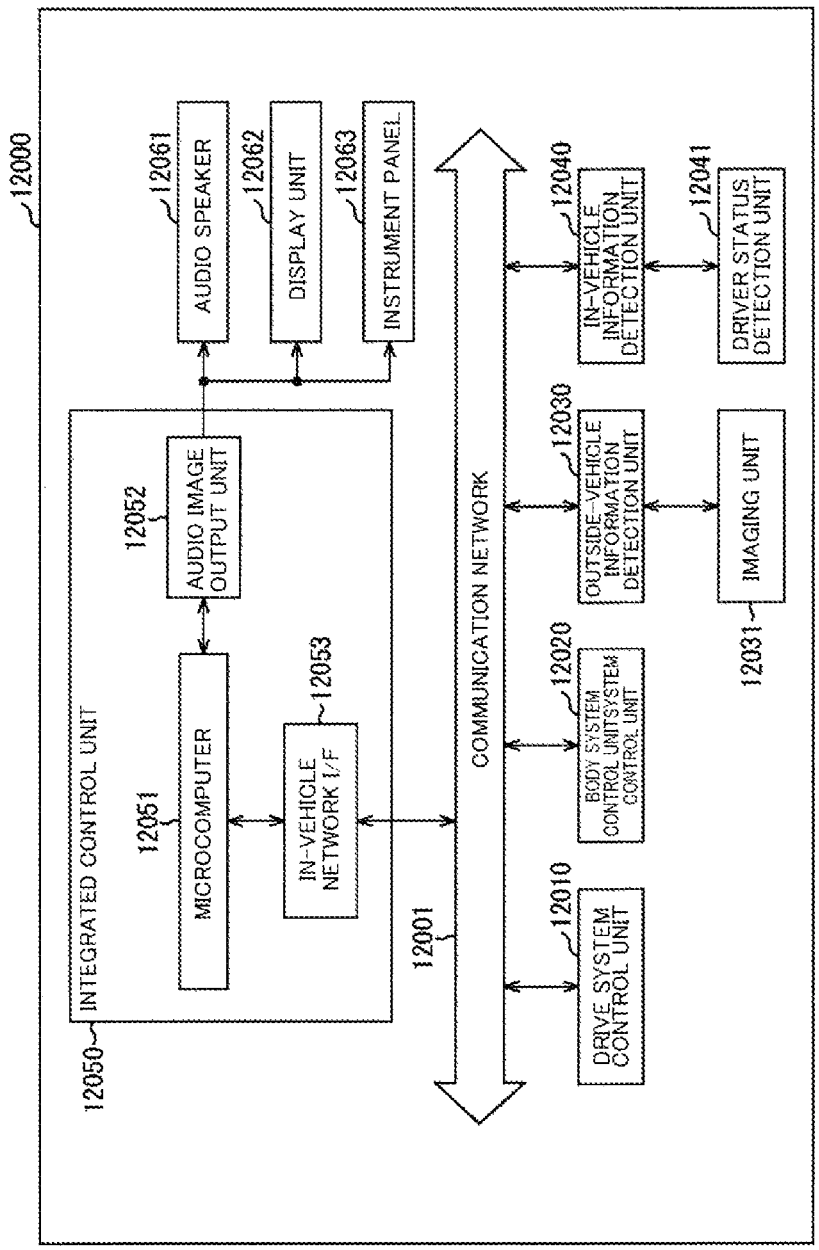
FIG. 21 is a block diagram showing an example of a schematic configuration of a vehicle control system.

FIG. 21 is a block diagram showing a schematic configuration example of a vehicle control system, which is an example of a moving object control system to which the technology according to the present disclosure can be applied.

A vehicle control system 12000 includes a plurality of electronic control units connected via a communication network 12001. In the example shown in FIG. 21, the vehicle control system 12000 includes a drive system control unit 12010, a body system control unit 12020, an outside-vehicle information detection unit 12030, an in-vehicle information detection unit 12040, and an integrated control unit 12050. In addition, as the functional configuration of the integrated control unit 12050, a microcomputer 12051, an audio image output unit 12052, and an in-vehicle network interface (I/F) 12053 are shown.

The drive system control unit 12010 controls the operation of a device related to a vehicle drive system according to various programs. For example, the drive system control unit 12010 functions as a control device for a driving force generating device for generating a driving force of a vehicle such as an internal combustion engine or a drive motor, a driving force transmission mechanism for transmitting a driving force to wheels, a steering mechanism for adjusting a steering angle of a vehicle, and a braking device for generating a braking force of a vehicle.

The body system control unit 12020 controls operations of various devices mounted in a vehicle body according to various programs. For example, the body system control unit 12020 functions as a control device such as a keyless entry system, a smart key system, a power window device, or various lamps such as a headlamp, a back lamp, a brake lamp, a turn signal and a fog lamp. In this case, radio waves transmitted from a portable device that substitutes for a key or signals of various switches may be input to the body system control unit 12020. The body system control unit 12020 receives such a radio wave or signal input, and controls a door lock device, a power window device, and a lamp of the vehicle.

The outside-vehicle information detection unit 12030 detects information outside the vehicle in which the vehicle control system 12000 is mounted. For example, an imaging unit 12031 is connected to the outside-vehicle information detection unit 12030. The outside-vehicle information detection unit 12030 causes the imaging unit 12031 to capture an image of the outside of the vehicle and receives the captured image. The outside-vehicle information detection unit 12030 may perform object detection processing or distance detection processing for peoples, cars, obstacles, signs, and letters on the road based on the received image.

The imaging unit 12031 is an optical sensor that receives light and outputs an electrical signal according to the intensity of the light received. The imaging unit 12031 can also output the electrical signal as an image and ranging information. In addition, the light received by the imaging unit 12031 may be visible light or invisible light such as infrared rays.

The in-vehicle information detection unit 12040 detects information in the vehicle. In the in-vehicle information detection unit 12040, for example, a driver status detection unit 12041 that detects the driver's status is connected. The driver status detection unit 12041 includes, for example, a camera that images the driver, and the in-vehicle information detection unit 12040 may calculate the degree of fatigue or degree of concentration of the driver based on detection information input from the driver status detection unit 12041, and may determine whether the driver is asleep.

The microcomputer 12051 can calculate a control target value of the driving force generator, the steering mechanism, or the braking device on the basis of the information on inside and outside the vehicle acquired by the outside-vehicle information detection unit 12030 or the in-vehicle information detection unit 12040, and output a control command to the drive system control unit 12010. For example, the microcomputer 12051 can perform cooperative control in order to realize functions of an advanced driver assistance system (ADAS) such as following traveling, vehicle speed maintenance driving, vehicle collision warning, and vehicle lane deviation warning based on vehicle collision avoidance, impact mitigation, and inter-vehicle distance.

In addition, the microcomputer 12051 can perform cooperative control for automatic driving in which autonomous driving is performed without the operation of the driver by controlling the driving force generating device, the steering mechanism or the braking device based on information around the vehicle acquired by the outside-vehicle information detection unit 12030 or the in-vehicle information detection unit 12040.

In addition, the microcomputer 12051 can output a control command to the body system control unit 12020 based on the information outside the vehicle acquired by the outside-vehicle information detection unit 12030. For example, the microcomputer 12051 can perform cooperative control for antiglare such as switching a high beam to a low beam by controlling a headlamp according to a position of a preceding vehicle or an oncoming vehicle detected by the outside-vehicle information detection unit 12030.

The audio image output unit 12052 transmits an output signal of at least one of audio and an image to an output device that can visually or audibly notify the passenger of the vehicle or the outside of information. In the example shown in FIG. 21, as such an output device, an audio speaker 12061, a display unit 12062 and an instrument panel 12063 are shown. The display unit 12062 may include, for example, at least one of an onboard display and a head-up display.

Figure 22:
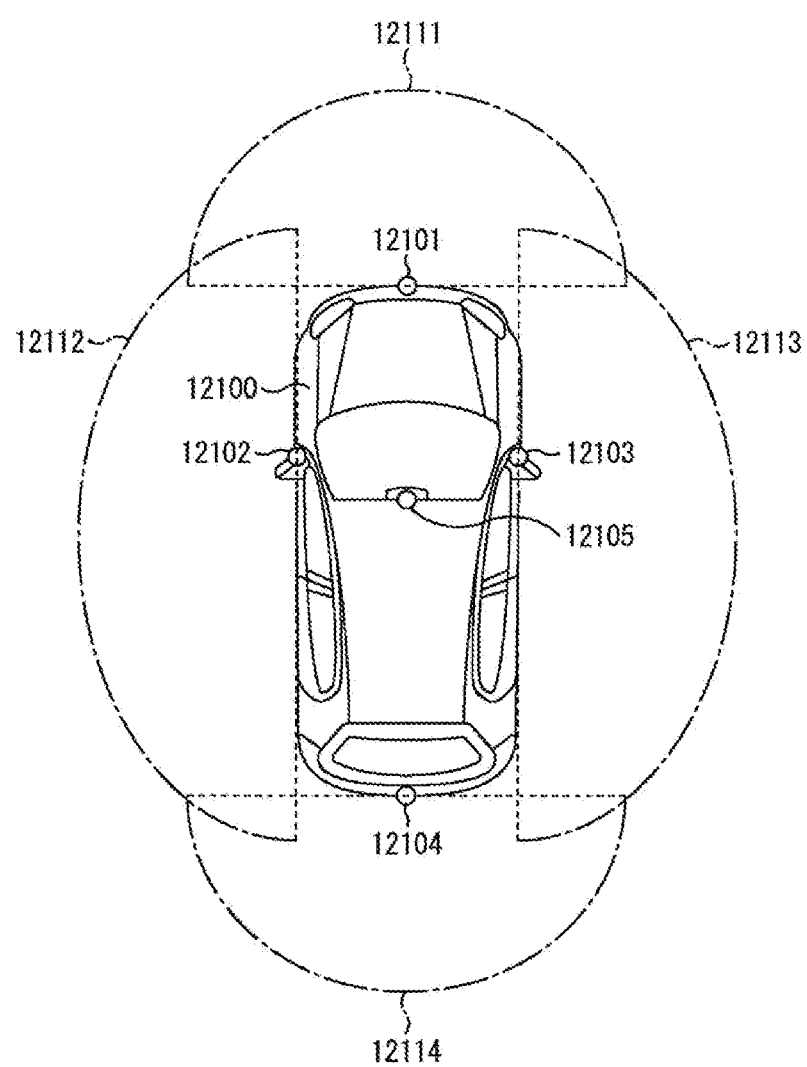
FIG. 22 is an explanatory diagram showing an example of installation positions of an outside-vehicle information detection unit and imaging units.

FIG. 22 is a diagram showing an example of an installation position of the imaging unit 12031.

In FIG. 22, a vehicle 12100 includes imaging units 12101, 12102, 12103, 12104, and 12105 as the imaging unit 12031.

The imaging units 12101, 12102, 12103, 12104, and 12105 may be provided at positions such as a front nose, side-view mirrors, a rear bumper, a back door, and an upper part of a windshield in a vehicle interior of the vehicle 12100, for example. The imaging unit 12101 provided at the front nose and the imaging unit 12105 provided at an upper part of the windshield in the vehicle interior mainly obtains front view images of the vehicle 12100. The imaging units 12102 and 12103 provided in the side-view mirrors mainly obtain side view images of the vehicle 12100. The imaging unit 12104 provided in the rear bumper or the back door mainly obtains a rear view image of the vehicle 12100. The front images acquired by the imaging units 12101 and 12105 are mainly used for detecting preceding vehicles, pedestrians, obstacles, traffic lights, traffic signs, lanes and the like.

Here, FIG. 22 shows an example of imaging ranges of the imaging units 12101 to 12104. An imaging range 12111 indicates an imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposition of image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements or an imaging element having pixels for phase difference detection.

For example, the microcomputer 12051 determines a distance to each three-dimensional object in the imaging ranges 12111 to 12114, and a change in the distance over time (a relative speed with respect to the vehicle 12100) based on the distance information obtained from the imaging units 12101 to 12104, and particularly, can extract a three-dimensional object that travels at a predetermined speed (for example, 0 km/h or more) in almost the same direction as the vehicle 12100, which is the closest three-dimensional object on the traveling path of the vehicle 12100, as a preceding vehicle. In addition, the microcomputer 12051 can set an inter-vehicle distance to be secured in advance in front of the preceding vehicle, and perform automatic brake control (including following stop control), automatic acceleration control (including following start control), and the like. In this manner, it is possible to perform cooperative control for automatic driving in which autonomous driving is performed without the operation of the driver.

For example, based on the distance information obtained from the imaging units 12101 to 12104, the microcomputer 12051 classifies the three-dimensional object data related to the three-dimensional object as a two-wheeled vehicle, an ordinary vehicle, a large vehicle, a pedestrian, a utility pole or another three-dimensional object and performs extraction, and can us the result for automatic avoidance of an obstacle. For example, the microcomputer 12051 distinguishes obstacle around the vehicle 12100 as obstacles that the driver of the vehicle 12100 can visually recognize and obstacles that are difficult for the driver to visually recognize. Then, the microcomputer 12051 determines a collision risk indicating the degree of risk of collision with each obstacle, and when the collision risk is equal to or higher than the set value and there is a possibility of collision, an alarm is output to the driver through the audio speaker 12061 and the display unit 12062, forced deceleration and avoidance steering are performed through the drive system control unit 12010, and thus it is possible to perform driving support for collision avoidance.

At least one of the imaging units 12101 to 12104 may be an infrared camera that detects infrared rays. For example, the microcomputer 12051 can recognize a pedestrian by determining whether there is a pedestrian in the captured image of the imaging units 12101 to 12104. Such pedestrian recognition is performed by, for example, a procedure in which feature points in the captured images of the imaging units 12101 to 12104 as infrared cameras are extracted and a procedure in which pattern matching processing is performed on a series of feature points indicating the outline of the object and it is determined whether the object is a pedestrian. When the microcomputer 12051 determines that there is a pedestrian in the captured images of the imaging units 12101 to 12104, and the pedestrian is recognized, the audio image output unit 12052 controls the display unit 12062 so that the recognized pedestrian is superimposed and displayed with a square contour line for emphasis. In addition, the audio image output unit 12052 may control the display unit 12062 so that an icon or the like indicating a pedestrian is displayed at a desired position.

An example of the vehicle control system to which the technology according to the present disclosure can be applied has been described above. The technology according to the present disclosure can be applied to the imaging unit 12031 within the configuration described above. Specifically, the solid-state imaging device 1 in FIG. 1 can be applied to the imaging unit 12031. By applying the technique according to the present disclosure to the imaging unit 12031, flare can be suppressed and a clearer captured image can be obtained, which makes it possible to reduce driver fatigue.

5. Application Example to Endoscopic Surgery System

The technology according to the present disclosure (the present technology) may be applied to, for example, an endoscopic surgery system.

Figure 23:
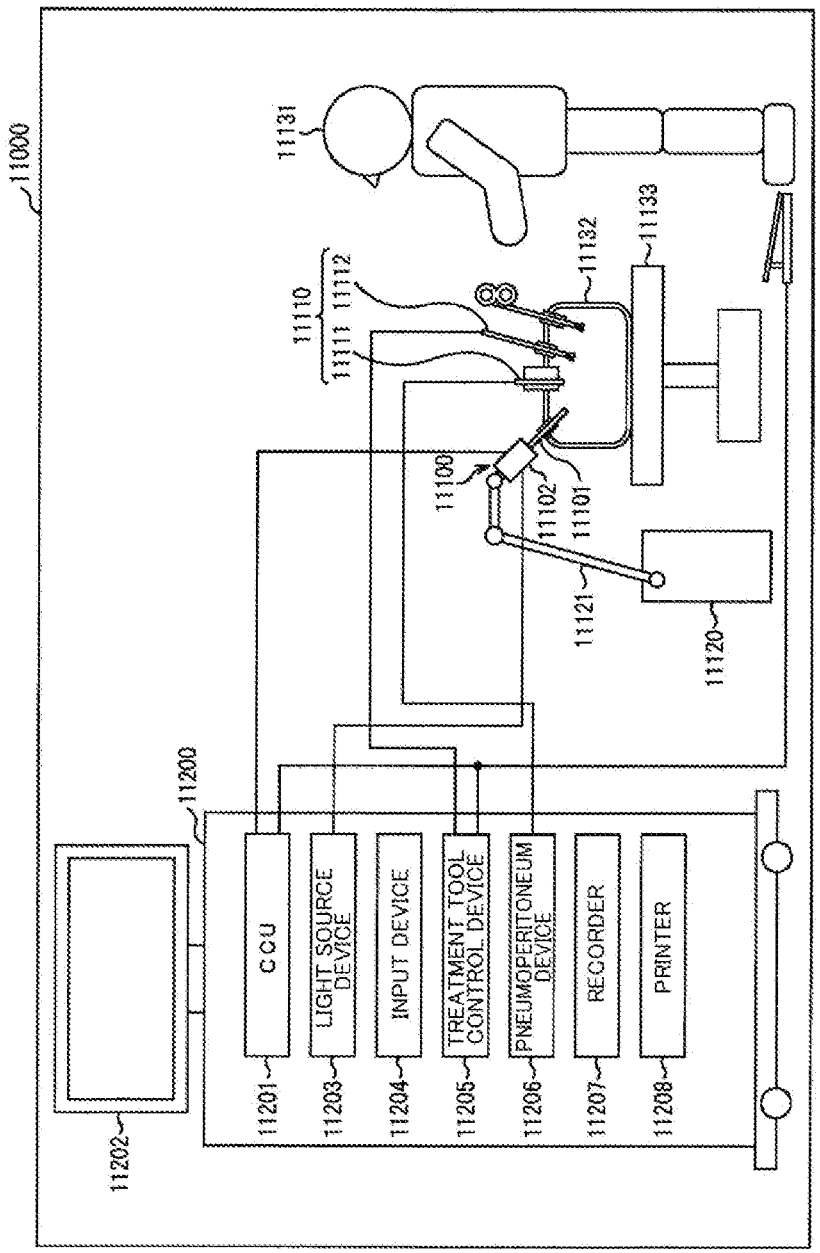
FIG. 23 is a diagram showing an example of a schematic configuration of an endoscopic surgery system.

FIG. 23 is a diagram showing an example of a schematic configuration of an endoscopic surgery system to which the technology according to the present disclosure (the present technology) can be applied.

FIG. 23 shows a state where a surgeon (doctor) 11131 is performing a surgical operation on a patient 11132 on a patient bed 11133 by using the endoscopic surgery system 11000. As shown, the endoscopic surgery system 11000 is composed of an endoscope 11100, another surgical tool 11110 such as a pneumoperitoneum tube 11111 and an energy treatment tool 11112, a support arm device 11120 that supports the endoscope 11100, and a cart 11200 in which various devices for endoscopic surgery are mounted.

The endoscope 11100 is composed of a lens barrel 11101 in which a region having a predetermined length from the tip is inserted into the body cavity of the patient 11132 and a camera head 11102 connected to the base end of the lens barrel 11101. In the shown example, the endoscope 11100 configured as a so-called rigid endoscope having the rigid lens barrel 11101 is shown, but the endoscope 11100 may be configured as a so-called soft endoscope having a soft lens barrel.

An opening into which an objective lens is fitted is provided at the tip of the lens barrel 11101. A light source device 11203 is connected to the endoscope 11100, and light generated by the light source device 11203 is guided to the tip of the lens barrel by the light guide extending inside the lens barrel 11101, and emitted to an observation target in the body cavity of the patient 11132 via the objective lens. Here, the endoscope 11100 may be a direct endoscope or may be a perspective endoscope or a side endoscope.

An optical system and an imaging element are provided inside the camera head 11102, and reflected light (observation light) from the observation target is condensed on the imaging element by the optical system. The observation light is photoelectrically converted by the imaging element, and an electrical signal corresponding to the observation light, that is, an image signal corresponding to the observation image is generated. The image signal is transmitted as RAW data to a camera control unit (CCU) 11201.

The CCU 11201 is composed of a central processing unit (CPU), a graphics processing unit (GPU) or the like, and comprehensively controls the operation of the endoscope 11100 and a display device 11202. In addition, the CCU 11201 receives an image signal from the camera head 11102, and performs various types of image processing for displaying an image based on the image signal, for example, development processing (demosaic processing) on the image signal.

The display device 11202 displays an image based on an image signal having been subjected to image processing by the CCU 11201 under the control of the CCU 11201.

The light source device 11203 is composed of, for example, a light source such as a light emitting diode (LED), and supplies irradiation light when a surgical part or the like is imaged to the endoscope 11100.

An input device 11204 is an input interface for the endoscopic surgery system 11000. A user can input various types of information and input an instruction to the endoscopic surgery system 11000 via the input device 11204. For example, the user inputs an instruction to change imaging conditions (the type of irradiation light, a magnification, a focal distance and the like) and the like by the endoscope 11100.

A treatment tool control device 11205 controls driving of the energy treatment tool 11112 for tissue cauterization, incision or blood vessel sealing. In order to secure a field of view of the endoscope 11100 and secure an operation space of the surgeon, a pneumoperitoneum device 11206 sends a gas into a body cavity via the pneumoperitoneum tube 11111 in order to inflate the body cavity of the patient 11132. A recorder 11207 is a device that can record various types of information related to surgery. A printer 11208 is a device that can print various types of information related to surgery in various formats such as text, images and graphs.

Here, the light source device 11203 that supplies irradiation light when a surgical part is imaged to the endoscope 11100 can be composed of, for example, an LED, a laser light source or a white light source composed of a combination thereof. When a white light source is composed of a combination of RGB laser light sources, since the output intensity of each color (each wavelength) and the output timing can be controlled with high accuracy, white balance of the captured image can be adjusted in the light source device 11203. In addition, in this case, laser light from each of the RGB laser light sources is emitted to the observation target in a time-division manner, driving of the imaging element of the camera head 11102 is controlled in synchronization with the emission timing, and thus an image corresponding to each RGB can be captured in a time-division manner. According to the method, a color image can be obtained without providing a color filter in the imaging element.

In addition, driving of the light source device 11203 may be controlled so that the intensity of the output light changes at predetermined times. When driving of the imaging element of the camera head 11102 is controlled in synchronization with the timing of the change in the light intensity, an image is acquired in a time-division manner, and the image is synthesized, a so-called image in a high dynamic range without underexposure or overexposure can be generated.

In addition, the light source device 11203 may have a configuration in which light in a predetermined wavelength band corresponding to special light observation can be supplied. In the special light observation, for example, by emitting light in a narrower band than irradiation light (that is, white light) during normal observation using wavelength dependence of light absorption in a body tissue, so-called narrow band light observation (narrow band imaging) in which a predetermined tissue such as a blood vessel in the mucous membrane surface layer is imaged with a high contrast is performed. Alternatively, in the special light observation, fluorescence observation in which an image is obtained by fluorescence generated by emitting excitation light may be performed. The fluorescence observation can be performed by emitting excitation light to a body tissue, and observing fluorescence from the body tissue (autofluorescence observation), or locally injecting a reagent such as indocyanine green (ICG) to a body tissue, and emitting excitation light corresponding to a fluorescence wavelength of the reagent to the body tissue to obtain a fluorescence image. The light source device 11203 can supply narrow band light and/or excitation light corresponding to such special light observation.

Figure 24:
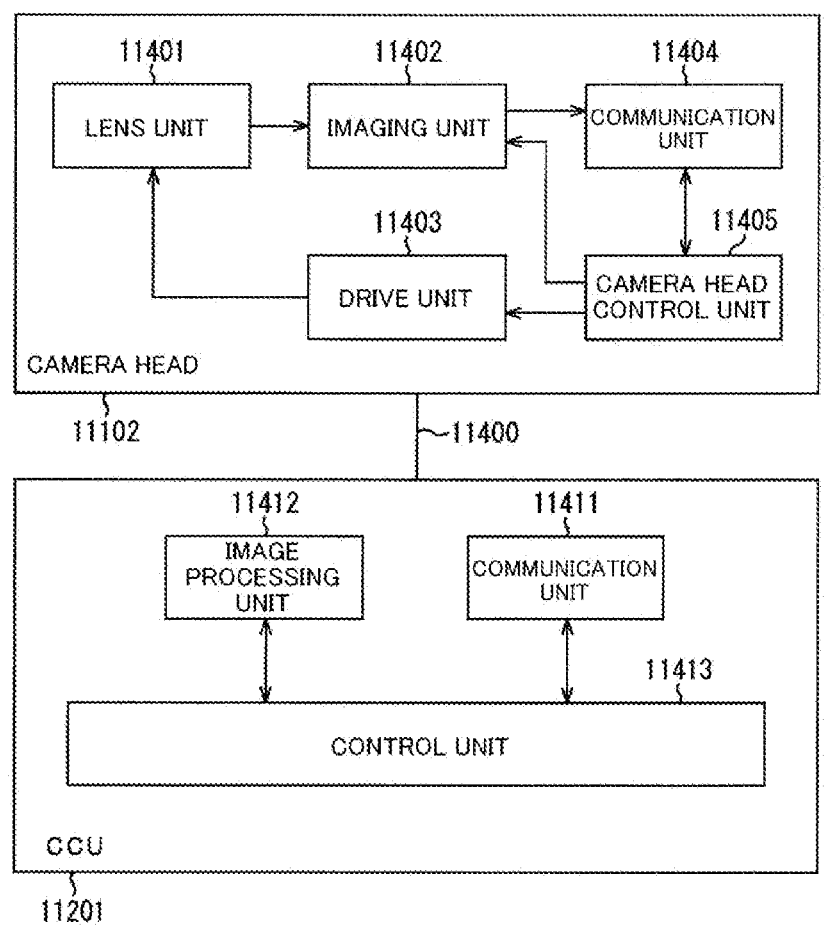
FIG. 24 is a block diagram showing an example of a functional configuration of a camera head and a CCU.

FIG. 24 is a block diagram illustrating an example of a functional configuration of the camera head 11102 and the CCU 11201 illustrated in FIG. 23.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected to each other via a transmission cable 11400 so that they can communicate with each other.

The lens unit 11401 is an optical system provided at the connection part with respect to the lens barrel 11101. Observation light taken from the tip of the lens barrel 11101 is guided to the camera head 11102 and enters the lens unit 11401. The lens unit 11401 is composed of a combination of a plurality of lenses including a zoom lens and a focus lens.

The imaging unit 11402 is composed of an imaging element. The imaging element constituting the imaging unit 11402 may be one element (so-called single plate type) or a plurality of elements (so-called multi-plate type). When the imaging unit 11402 is composed of a multi-plate type, for example, image signals corresponding to RGBs are generated by the imaging elements, and synthesized, and thereby a color image may be obtained. Alternatively, the imaging unit 11402 may include a pair of imaging elements for acquiring image signals for the right eye and the left eye corresponding to 3D (dimensional) display. When 3D display is performed, the surgeon 11131 can determine the depth of biological tissues in the surgical part more accurately. Here, when the imaging unit 11402 is composed of a multi-plate type, a plurality of lens units 11401 may be provided according to the imaging elements.

In addition, the imaging unit 11402 need not necessarily be provided in the camera head 11102. For example, the imaging unit 11402 may be provided inside the lens barrel 11101, immediately after the objective lens.

The drive unit 11403 is composed of an actuator, and moves the zoom lens and the focus lens of the lens unit 11401 along the optical axis by a predetermined distance according to the control from the camera head control unit 11405. Thereby, the magnification and the focus of the image captured by the imaging unit 11402 can be appropriately adjusted.

The communication unit 11404 is configured of a communication device for transmitting or receiving various information to or from the CCU 11201. The communication unit 11404 transmits the image signal obtained from the imaging unit 11402 as RAW data to the CCU 11201 via the transmission cable 11400.

In addition, the communication unit 11404 receives a control signal for controlling driving of the camera head 11102 from the CCU 11201 and supplies it to the camera head control unit 11405. The control signal includes information related to imaging conditions, for example, information specifying a frame rate of a captured image, information specifying an exposure value during imaging, and/or information specifying a magnification and a focus of a captured image.

Here, imaging conditions such as a frame rate, an exposure value, a magnification, and a focus may be appropriately specified by the user, or may be automatically set by the control unit 11413 of the CCU 11201 based on the acquired image signal. In the latter case, a so-called auto exposure (AE) function, auto focus (AF) function and auto white balance (AWB) function are provided in the endoscope 11100.

The camera head control unit 11405 controls the driving of the camera head 11102 on the basis of the control signal from the CCU 11201 received via the communication unit 11404.

The communication unit 11411 is composed of a communication device for transmitting and receiving various types of information to and from the camera head 11102. The communication unit 11411 receives the image signal transmitted from the camera head 11102 via the transmission cable 11400.

In addition, the communication unit 11411 transmits a control signal for controlling the driving of the camera head 11102 to the camera head 11102. The image signal and the control signal can be transmitted through telecommunication, optical communication or the like.

The image processing unit 11412 performs various types of image processing on the image signal, which is RAW data transmitted from the camera head 11102.

The control unit 11413 performs various controls related to imaging of a surgical part and the like with the endoscope 11100 and displaying of the captured image obtained by imaging a surgical part and the like. For example, the control unit 11413 generates a control signal for controlling driving of the camera head 11102.

In addition, the control unit 11413 causes the display device 11202 to display a captured image showing the surgical part and the like based on the image signal on which image processing is performed by the image processing unit 11412. In this case, the control unit 11413 may recognize various objects in the captured image using various image recognition technologies. For example, the control unit 11413 can recognize surgical tools such as forceps, specific biological parts, bleeding, mist when the energy treatment tool 11112 is used and the like by detecting the edge shape and color of the object included in the captured image. When the control unit 11413 causes the display device 11202 to display the captured image, it may cause various types of surgical support information to be superimposed and displayed with the image of the surgical part using the recognition result. When the surgical support information is superimposed and displayed, and presented to the surgeon 11131, it is possible to reduce the burden on the surgeon 11131 and the surgeon 11131 can reliably proceed the surgery.

The transmission cable 11400 connecting the camera head 11102 and the CCU 11201 to each other is an electric signal cable that supports electric signal communication, an optical fiber that supports optical communication, or a composite cable thereof.

Here, in the example shown in the drawing, communication is performed in a wired manner using the transmission cable 11400, but communication between the camera head 11102 and the CCU 11201 may be performed in a wireless manner.

An example of the endoscopic surgery system to which the technology according to the present disclosure can be applied has been described above. The technology according to the present disclosure can be applied to the imaging unit 11402 within the configuration described above. Specifically, the solid-state imaging device 1 in FIG. 1 can be applied to the imaging unit 10402. By applying the technology according to the present disclosure to the imaging unit 10402, it is possible to obtain a clearer image of the surgical part and thus, the operator can reliably confirm the surgical part.

While the endoscopic surgery system has been described here as an example, the technology according to the present disclosure may be applied to other systems, for example, a microscopic surgery system.

Note that the present technique can also take on the following configurations.

(1) A solid-state imaging device including: a plurality of photoelectric conversion units formed on a substrate to generate signal charges according to an amount of incident light; a microlens array including a microlens formed for a photoelectric conversion unit group including at least two or more adjacent photoelectric conversion units to guide incident light to the photoelectric conversion unit group; a scatterer disposed on an optical path of the incident light collected by the microlens; and an inter-pixel light shielding portion including a groove formed between the photoelectric conversion unit of the photoelectric conversion unit group and the photoelectric conversion unit adjacent to the photoelectric conversion unit group and an insulating material filled in the groove, wherein an opening side of an inner side surface of the groove on the scatterer side is a flat surface inclined or a curved surface curved so that a groove width becomes narrower toward a bottom of the groove.

(2) The solid-state imaging device according to (1), wherein a bottom side of the inner side surface of the groove on the scatterer side is a flat surface formed so as to extend in a depth direction from a light receiving surface side of the substrate so that the groove width is constant.

(3) The solid-state imaging device according to (1) or (2), wherein the scatterer includes a scatterer groove formed between the photoelectric conversion units in the photoelectric conversion unit group and a scatterer insulating material filled in the scatterer groove, and two inner side surfaces of the scatterer groove are flat surfaces formed so as to extend in a depth direction from a light receiving surface side of the substrate so that a groove width is constant.

(4) The solid-state imaging device according to (1) or (2), wherein the scatterer includes a scatterer groove formed between the photoelectric conversion units in the photoelectric conversion unit group and a scatterer insulating material filled in the scatterer groove, and the scatterer groove has the same shape as the groove.

(5) The solid-state imaging device according to (1) or (2), wherein the scatterer is disposed between the microlens and the substrate, and an impurity layer is formed between the photoelectric conversion units in the photoelectric conversion unit group.

(6) The solid-state imaging device according to (3) or (4), wherein the insulating material in the groove has a refractive index lower than that of the scatterer insulating material.

(7) The solid-state imaging device according to any one of (3), (4), and (6), wherein the scatterer insulating material is any one of titanium oxide, silicon nitride, zirconium oxide, hafnium oxide, tantalum oxide, zinc oxide, and a resin having a higher refractive index than that of silicon oxide.

(8) The solid-state imaging device according to any one of (1) to (7), wherein an opening side of the inner side surface of the groove on the scatterer side is a flat surface inclined, with respect to the thickness direction of the substrate, at an angle equal to or higher than a critical angle which is a minimum incidence angle at which total reflection occurs when light is incident from the photoelectric conversion unit to the inter-pixel light shielding portion.

(9) The solid-state imaging device according to (8), wherein the insulating material is a silicon oxide, and the critical angle is 20.5°.

(10) The solid-state imaging device according to any one of (1) to (7), wherein the opening side of the inner side surface of the groove on the scatterer side is a curved surface whose angle with the thickness direction of the substrate becomes smaller toward the bottom of the groove.

(11) An electronic device including: a solid-state imaging device including: a plurality of photoelectric conversion units formed on a substrate to generate signal charges according to an amount of incident light; a microlens array including a microlens formed for a photoelectric conversion unit group including at least two or more adjacent photoelectric conversion units to guide incident light to the photoelectric conversion unit group; a scatterer disposed on an optical path of the incident light collected by the microlens; and an inter-pixel light shielding portion including a groove formed between the photoelectric conversion unit of the photoelectric conversion unit group and the photoelectric conversion unit adjacent to the photoelectric conversion unit group and an insulating material filled in the groove, an opening side of an inner side surface of the groove on the scatterer side being a flat surface inclined or a curved surface curved so that a groove width becomes narrower toward a bottom of the groove; an optical lens that forms image light from a subject on an imaging surface of the solid-state imaging device; and a signal processing circuit that processes a signal output from the solid-state imaging device.

REFERENCE SIGNS LIST

1 Solid-state imaging device
2 Substrate
3 Pixel region
4 Vertical driving circuit
5 Column signal processing circuit
6 Horizontal driving circuit
7 Output circuit
8 Control circuit
9 Pixel
10 Pixel driving wiring
11 Vertical signal line
12 Horizontal signal line
13 Insulating film
14 Light shielding film 15 Light receiving layer
16 Color filter
17 Microlens
18 Light collecting layer
19 Wiring layer
20 Supporting substrate
21 Photoelectric conversion unit
23 Photoelectric conversion unit group
24 Incident light
25 Scatterer
26 Scatterer groove
27 Scatterer insulating material
28 Scattered light
29 Inter-pixel light shielding portion
30 Groove
31 Insulating material
32 Color filter array
33 Microlens array
34 Insulating interlayer film
35 Wiring
36 Intermediate layer
37 Impurity layer
100 Electronic device
101 Solid-state imaging device
102 Optical lens
103 Shutter device
104 Driving circuit
105 Signal processing circuit
106 Incident light

The invention claimed is:

1. A solid-state imaging device, comprising:
a plurality of photoelectric conversion units on a substrate, wherein the plurality of photoelectric conversion units is configured to generate signal charges based on an amount of incident light;
a photoelectric conversion unit group that includes at least two adjacent photoelectric conversion units of the plurality of photoelectric conversion units;
a microlens array that includes a microlens for the photoelectric conversion unit group, wherein the microlens is configured to guide the incident light to the photoelectric conversion unit group;
a scatterer on an optical path of the incident light guided by the microlens; and
an inter-pixel light shielding portion that includes:
a groove between:
a photoelectric conversion unit of the at least two adjacent photoelectric conversion units of the photoelectric conversion unit group, and
a photoelectric conversion unit adjacent to the photoelectric conversion unit group; and
an insulating material in the groove, wherein
an opening side of an inner side surface of the groove on a side of the scatterer is one of:
a first flat surface that is inclined, or
a curved surface,
a groove width of the groove narrows as a depth of the groove increases in a first portion of the groove,
a bottom side of the inner side surface of the groove on the side of the scatterer is a second flat surface in a second portion of the groove,
the second flat surface extends in a depth direction from a light receiving surface side of the substrate, and
the groove width of the groove in the second portion of the groove is constant.

2. The solid-state imaging device according to claim 1, wherein
the scatterer includes:
a scatterer groove between the at least two adjacent photoelectric conversion units in the photoelectric conversion unit group; and
a scatterer insulating material in the scatterer groove,
two inner side surfaces of the scatterer groove are flat surfaces, wherein the flat surfaces of the scatterer groove extend in the depth direction from the light receiving surface side of the substrate, and
a groove width of the scatterer groove is constant.

3. The solid-state imaging device according to claim 1, wherein
the scatterer includes:
a scatterer groove between the at least two adjacent photoelectric conversion units in the photoelectric conversion unit group; and
a scatterer insulating material in the scatterer groove, and
a shape of the groove of the inter-pixel light shielding portion is same as a shape of the scatterer groove.

4. The solid-state imaging device according to claim 1, further comprising an impurity layer between the at least two adjacent photoelectric conversion units in the photoelectric conversion unit group, wherein
the scatterer is between the microlens and the substrate.

5. The solid-state imaging device according to claim 2, wherein
the insulating material in the groove has a refractive index lower than a refractive index of the scatterer insulating material.

6. The solid-state imaging device according to claim 2, wherein
the scatterer insulating material is one of titanium oxide, silicon nitride, zirconium oxide, hafnium oxide, tantalum oxide, zinc oxide, or a resin, and
the scatterer insulating material has a refractive index higher than a refractive index of silicon oxide.

7. The solid-state imaging device according to claim 1, wherein
the opening side of the inner side surface of the groove on the side of the scatterer is the first flat surface that is inclined, with respect to a thickness direction of the substrate, at an angle equal to or higher than a critical angle,
the critical angle is a minimum incidence angle at which total reflection occurs based on incidence of the incident light from the photoelectric conversion unit of the photoelectric conversion unit group to the inter-pixel light shielding portion.

8. The solid-state imaging device according to claim 7, wherein
the insulating material includes silicon oxide, and
the critical angle is 20.5°.

9. The solid-state imaging device according to claim 1, wherein
the opening side of the inner side surface of the groove on the side of the scatterer is the curved surface whose angle with a thickness direction of the substrate decreases as the depth of the groove increases.

10. An electronic device, comprising:
a solid-state imaging device that includes:
a plurality of photoelectric conversion units on a substrate, wherein the plurality of photoelectric conversion units is configured to generate signal charges based on an amount of incident light;

a photoelectric conversion unit group that includes at least two adjacent photoelectric conversion units of the plurality of photoelectric conversion units;

a microlens array that includes a microlens for the photoelectric conversion unit group, wherein the microlens is configured to guide the incident light to the photoelectric conversion unit group;

a scatterer on an optical path of the incident light guided by the microlens; and an inter-pixel light shielding portion that includes:
  a groove between:
    a first photoelectric conversion unit of the at least two adjacent photoelectric conversion units of the photoelectric conversion unit group, and
    a second photoelectric conversion unit adjacent to the photoelectric conversion unit group; and
  an insulating material in the groove, wherein
  an opening side of an inner side surface of the groove on a side of the scatterer is one of:
    a first flat surface that is inclined, or
    a curved surface,
  a groove width of the groove narrows as a depth of the groove increases in a first portion of the groove,
  a bottom side of the inner side surface of the groove on the side of the scatterer is a second flat surface in a second portion of the groove,
  the second flat surface extends in a depth direction from a light receiving surface side of the substrate, and
  the groove width of the groove in the second portion of the groove is constant;

an optical lens configured to form image light from a subject on an imaging surface of the solid-state imaging device; and a signal processing circuit configured to process a signal output from the solid-state imaging device.

11. The solid-state imaging device according to claim 1, wherein the inter-pixel light shielding portion further includes a plurality of flat inclined surfaces that includes the first flat surface such that the groove width narrows as the depth of the groove increases in the first portion of the groove.

12. The solid-state imaging device according to claim 1, further comprising:
  a color filter;
  an intermediate layer between the color filter and the substrate; and
  an oblate spherical scatterer on the optical path of the incident light guided by the microlens,
    wherein the intermediate layer includes the oblate spherical scatterer.

* * * * *